(12) United States Patent
Kiyokawa

(10) Patent No.: US 11,693,026 B2
(45) Date of Patent: Jul. 4, 2023

(54) TEST CARRIER

(71) Applicant: ADVANTEST Corporation, Tokyo (JP)

(72) Inventor: Toshiyuki Kiyokawa, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 0 days.

(21) Appl. No.: 17/508,077

(22) Filed: Oct. 22, 2021

(65) Prior Publication Data

US 2023/0131189 A1    Apr. 27, 2023

(51) Int. Cl.
*G01R 31/28* (2006.01)
*G01R 1/04* (2006.01)

(52) U.S. Cl.
CPC ................... *G01R 1/0458* (2013.01)

(58) Field of Classification Search
CPC .............. G01R 1/073; G01R 1/07314; G01R 1/07328; G01R 31/2893
See application file for complete search history.

(56) References Cited

U.S. PATENT DOCUMENTS

| | | | |
|---|---|---|---|
| 6,340,838 B1 | 1/2002 | Chung et al. | |
| 6,445,203 B1 * | 9/2002 | Yamashita | G01R 31/2874 324/750.08 |
| 2001/0033010 A1 | 10/2001 | Tanioka et al. | |
| 2004/0178813 A1 | 9/2004 | Okubo | |
| 2005/0202716 A1 | 9/2005 | Saito | |
| 2006/0270265 A1 | 11/2006 | Saito | |
| 2010/0203676 A1 * | 8/2010 | Theuss | H01L 21/6835 257/E21.705 |
| 2019/0346482 A1 | 11/2019 | Kiyokawa et al. | |
| 2022/0011340 A1 | 1/2022 | Kiyokawa et al. | |
| 2022/0011341 A1 | 1/2022 | Kiyokawa et al. | |
| 2022/0011342 A1 | 1/2022 | Kiyokawa et al. | |
| 2022/0011343 A1 | 1/2022 | Kiyokawa et al. | |

FOREIGN PATENT DOCUMENTS

| | | |
|---|---|---|
| CN | 103529249 A | 1/2014 |
| CN | 112361044 A | 2/2021 |
| JP | H07-201428 A | 8/1995 |
| JP | H11-326449 A | 11/1999 |
| JP | 2003-285311 A | 10/2003 |
| JP | 2004-148432 A | 5/2004 |
| JP | 2019-197012 A | 11/2019 |
| KR | 10-2019-0129695 A | 11/2019 |
| WO | 03/075024 A1 | 9/2003 |
| WO | 2009/069189 A1 | 6/2009 |

OTHER PUBLICATIONS

Office Action issued in corresponding Taiwanese Application No. 11120932300; dated Sep. 22, 2022 (4 pages).
Office Action issued in corresponding Japanese Patent Application No. 2022-019093, dated Mar. 29, 2022 (6 pages).
Office Action issued in corresponding Korean Patent Application No. 10-2022-0023015, dated Apr. 12, 2022 (14 pages).
Office Action issued in counterpart Chinese Patent Application No. CN 202210270595.7 dated Mar. 6, 2023 (18 pages).

\* cited by examiner

*Primary Examiner* — Tung X Nguyen
(74) *Attorney, Agent, or Firm* — Osha Bergman Watanabe & Burton LLP

(57) ABSTRACT

A test carrier that accommodates a device under test (DUT) and has a through-hole facing the DUT, including: a movable valve that: opens by suction through the through hole such that the DUT is sucked through the through hole.

15 Claims, 17 Drawing Sheets

TEST CARRIER

BACKGROUND

Technical Field

The present invention relates to a test carrier carried in a state of accommodating an electronic component to be tested (hereinafter simply referred to as a "device under test" (DUT)) such as a semiconductor integrated circuit device at the time of testing the DUT.

Description of Related Art

Testing DUTs with fine pitch terminals requires a relatively expensive handler with multiple cameras and precise moving mechanisms in order to position (align) the DUT with high accuracy relative to the socket. On the other hand, a test carrier including a carrier body that holds a DUT, a lid member covering the DUT and attached to the carrier body, and a through hole for positioning the DUT formed in the carrier body is known (for example, see Patent Document 1). By using this test carrier, it is possible to test DUTs with fine pitch terminals by a relatively inexpensive handler with a mechanical positioning mechanism.

When the DUT is accommodated in the test carrier, the DUT is positioned with high accuracy relative to the contactor of the test carrier by using the camera through the through hole for positioning, and then the carrier body and the lid member are fixed. In order to prevent positional deviation of the DUT relative to the test carrier at this time, a through hole for sucking and holding the DUT is formed in the lid member.

PATENT DOCUMENT

Patent Document 1: JP 2019-197012 A

Since the handler is installed in a normal workspace having a relatively low cleanliness, foreign matter such as minute dust may enter the test carrier through the above-mentioned through hole for sucking the DUT, and the foreign matter may adhere to the DUT. On the other hand, the above-mentioned test carrier is disassembled in a clean room to remove the DUT from the test carrier after the test of the DUT is completed. Therefore, if the test carrier containing the DUT to which the foreign matter adheres is disassembled in the clean room, the foreign matter may be brought into the next process.

SUMMARY

One or more embodiments of the invention provide a test carrier capable of suppressing adhesion of foreign matter to a DUT.

[1] A test carrier according to one or more embodiments of the invention is a test carrier carried in a state of accommodating a device under test (DUT), the test carrier including: a through hole for sucking and holding the DUT, the through hole being disposed to face the DUT, and a movable valve that opens and closes the through hole in accordance with a suction of the through hole, in which when the through hole is sucked, the movable valve opens the through hole, and when the through hole is not sucked, the movable valve closes the through hole.

[2] In one or more embodiments of the invention, the movable valve may move or deform in accordance with the suction of the through hole.

[3] In one or more embodiments of the invention, the test carrier may further include: a holding member (i.e., a holder) that holds the DUT; and a lid member (i.e., a lid) that covers the DUT and is detachably attached to the holding member, and the through hole may be formed in a lid body of the lid member so that the through hole penetrates the lid body.

[4] In one or more embodiments of the invention, the holding member may include: contactors disposed to correspond to terminals of the DUT; external terminals electrically connected to the contactors; and a holding body that holds the contactors and the external terminals.

[5] In one or more embodiments of the invention, the lid body may have a contact surface that contacts the DUT, a first opening of the through hole may be open to the contact surface, and the DUT may be sandwiched between the contact surface and the contactors.

[6] In one or more embodiments of the invention, a second opening of the through hole may be open to an opposite surface of the lid body to the contact surface, and the second opening may be an opposite opening of the through hole to the first opening.

[7] In one or more embodiments of the invention, the through hole may include: a first hole part; an accommodating part (i.e., an accommodating chamber) that is connected to the first hole part and in which the movable valve is movably or deformably accommodated; and a second hole part that is connected to the first hole part via the accommodating part, when the through hole is sucked, the movable valve may allow the first hole part and the second hole part to communicate with each other, and when the through hole is not sucked, the movable valve may close between the first hole part and the second hole part.

[8] In one or more embodiments of the invention, the movable valve may have an outer diameter larger than an inner diameter of the second hole part, and when the through hole is not sucked, the movable valve may cover a third opening of the second hole part on the accommodating part side.

[9] In one or more embodiments of the invention, the first hole part and the second hole part may be arranged to be non-overlapping with each other in a transparent plan view.

[10] In one or more embodiments of the invention, the through hole may include a plurality of the second hole parts, and the second hole parts may be connected to the first hole part via the accommodating part.

[11] In one or more embodiments of the invention, the first hole part may have a circular cross-sectional shape, each of the second hole parts may have a circular cross-sectional shape having an inner diameter smaller than an inner diameter of the first hole part, the movable valve may have a circular shape having an outer diameter encompassing the second hole parts, and the accommodating part may have a circular cross-sectional shape having an inner diameter larger than the outer diameter of the movable valve.

[12] In one or more embodiments of the invention, the movable valve may have an outer diameter that is larger than an inner diameter of the first hole part and is larger than an inner diameter of the second hole part, the accommodating part may have an inner diameter that is larger than the outer diameter of the movable valve, and the movable valve may be accommodated in the accommodating part and may be movable between the first hole part and the second hole part.

[13] In one or more embodiments of the invention, the movable valve may include: a fourth opening; and a valve body having the fourth opening, the first hole part may be disposed to face the fourth opening, the second hole part may be disposed to face the valve body, when the through hole is sucked, the first hole part and the accommodating part may communicate with each other through the fourth opening, and when the through hole is not sucked, the valve body may cover a third opening of the second hole part on the accommodating part side.

[14] In one or more embodiments of the invention, the movable valve may be a valve member that is made of a metal material or a resin material and that has rigidity that is not deformed by suction of the through hole.

[15] In one or more embodiments of the invention, the movable valve may be a valve member that is made of an elastic material and that is elastically deformable by suction of the through hole, the movable valve may be fixed to the lid body at a fixing part (i.e., a fixer), and the fixing part may be disposed to face the first hole part.

[16] In one or more embodiments of the invention, the accommodating part may have a groove that is connected to the first hole part and may be disposed to face the second hole part through the movable valve.

[17] In one or more embodiments of the invention, the through hole may be sucked by a sucking and holding unit of a carrier assembling apparatus that assembles the test carrier so that the DUT may be sucked and held by the sucking and holding unit.

According to one or more embodiments of the invention, since the test carrier includes the movable valve that opens and closes the through hole in accordance with the suction of the through hole, it is possible to suppress adhesion of foreign matter to the DUT.

BRIEF DESCRIPTION OF DRAWINGS

FIG. 16A is a diagram illustrating a state before the lid member and the DUT are sucked and held by the second sucking and holding unit, and FIG. 16B is a diagram illustrating a state in which the lid member and the DUT are sucked and held by the second sucking and holding unit; FIG. 17A is a diagram illustrating an image of the DUT before alignment, FIG. 17B is a diagram illustrating an image of the DUT during alignment, and FIG. 17C is a diagram illustrating an image of the DUT after alignment.

DETAILED DESCRIPTION OF EMBODIMENTS

Hereinafter, embodiments of the invention will be described with reference to drawings.

Figure 1:
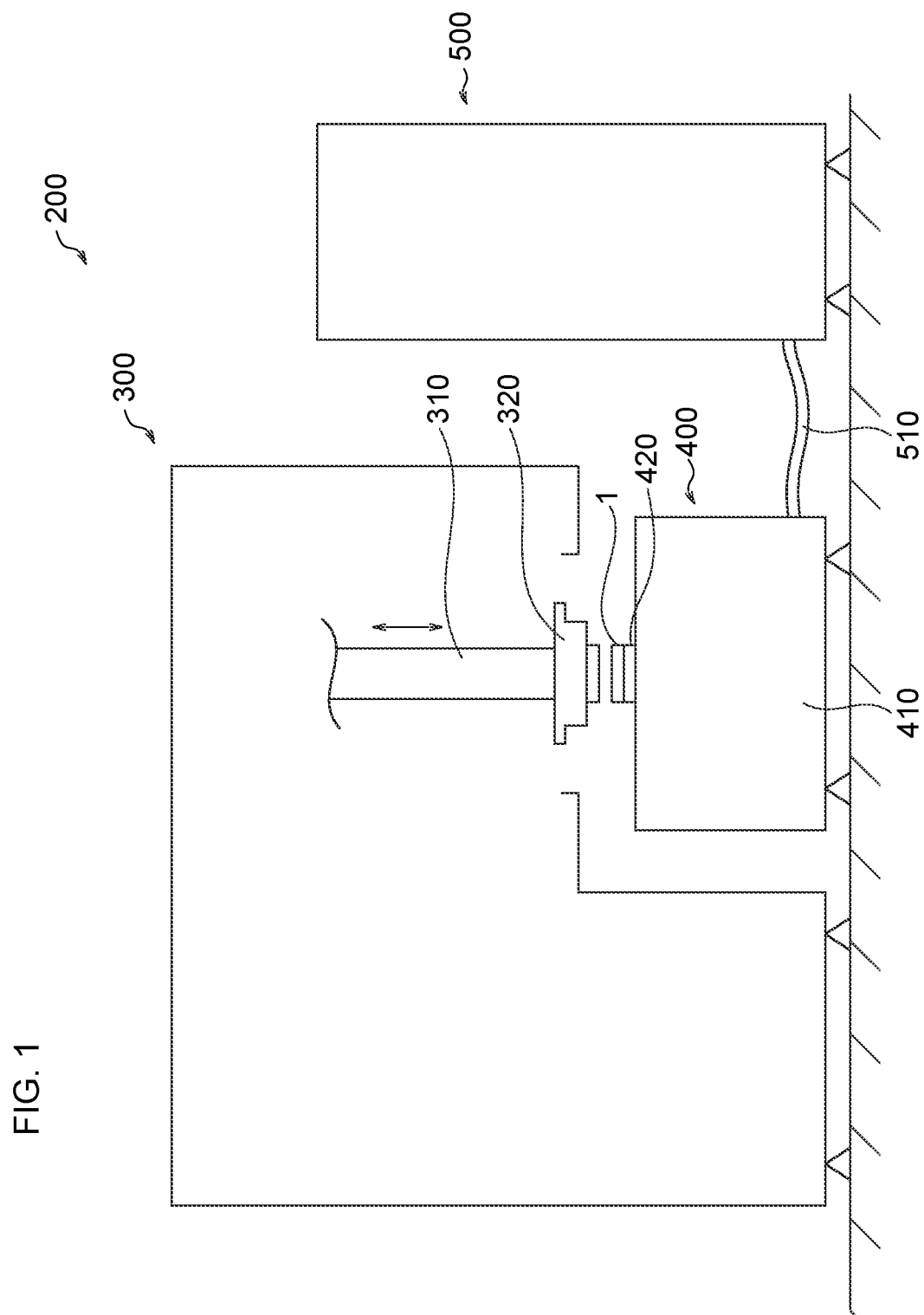
FIG. 1 is a schematic cross-sectional view showing an entire configuration of an electronic component testing apparatus in one or more embodiments of the present invention.
Figure 2:
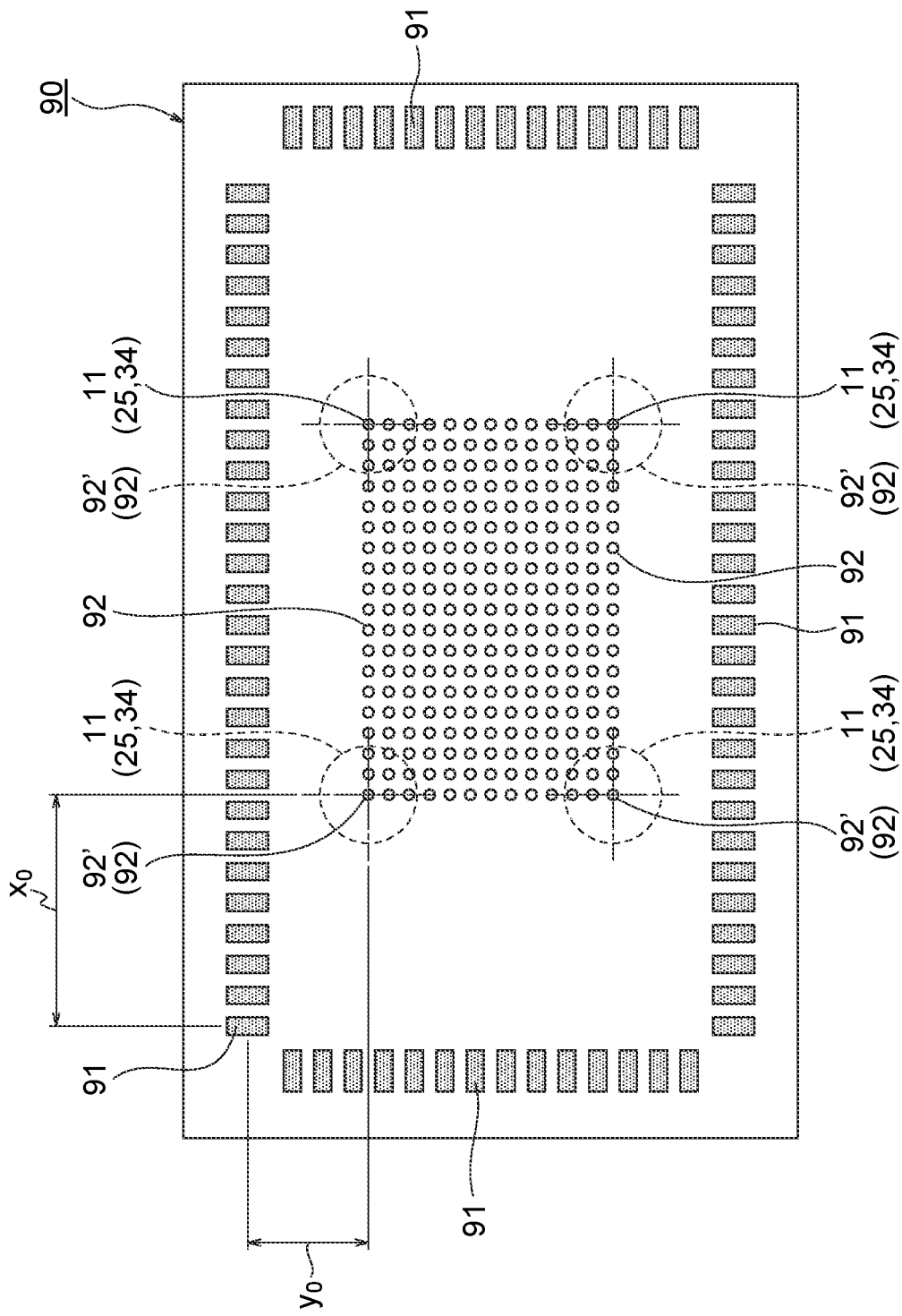
FIG. 2 is a bottom view illustrating a DUT that is a test object in one or more embodiments of the invention.

FIG. 1 is a schematic cross-sectional view showing an entire configuration of an electronic component testing apparatus 200 in one or more embodiments, and FIG. 2 is a bottom view illustrating a DUT 90 which is a test object in one or more embodiments.

The electronic component testing apparatus 200 in one or more embodiments is an apparatus that tests the electrical properties of the DUT 90. As shown in FIG. 1, the electronic component testing apparatus 200 includes a handler 300 that presses the DUT to the socket 420. The handler 300 has a positioning mechanism with mechanically positioning the DUT with respect to the socket 420 and does not have a high-precision positioning mechanism with image processing for the so-called fine pitch DUT. On the other hand, the DUT 90 in one or more embodiments is a die formed by dicing a semiconductor wafer and has pads 91 with fine pitch. Therefore, the test carrier 1 is used when the DUT 90 is tested by the electronic component testing apparatus 200.

In one or more embodiments, as illustrated in FIG. 2, the DUT 90 has pads 91 arranged along an outer edge of the DUT 90 and bumps 92 arranged in a center of the DUT 90. The pads 91 are terminals for testing the DUT 90 and are arranged at a relatively wide pitch. On the other hand, the bumps 92 are terminals for mounting the DUT 90 on a wiring board, etc. and are arranged at a narrower pitch than the pitch of the pads 91. A plurality of bumps 92 is arranged in a rectangular shape. A configuration of the DUTs 90 is not particularly limited to the above description. The pad 91 corresponds to an example of the "terminal of the DUT" in one or more embodiments of the present invention.

Figure 14:
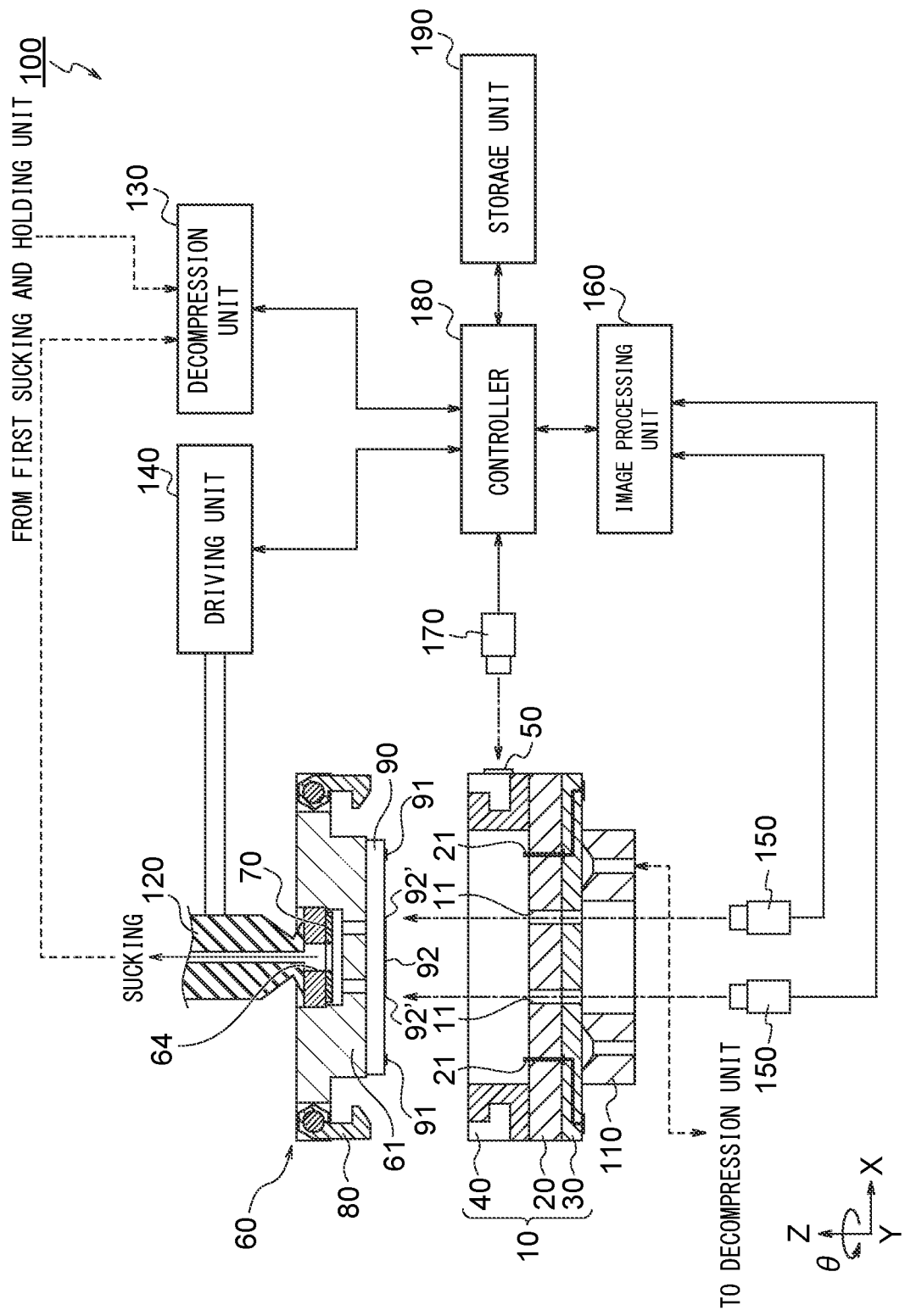
FIG. 14 is a block diagram illustrating a configuration of a carrier assembling apparatus in one or more embodiments of the invention.

In one or more embodiments, when the semiconductor wafer is diced to form the DUT 90, first, the DUT 90 is accommodated in the test carrier 1 using a carrier assembling apparatus 100 (see FIG. 14). Then, the test carrier 1 is carried into the electronic component testing apparatus 200 while the DUT 90 is accommodated in the test carrier 1, and the test carrier 1 is mounted on the test tray (not illustrated) for conveying the DUTs.

Then, the handler 300 conveys the test tray above the socket 420 of the test head 400 of the electronic component testing apparatus 200, the Z-axis driving device 310 drives to lower the pusher 320, and the test carrier 1 is pressed against the socket 420 by the pusher 320. As a result, the test carrier 1 is pressed against the socket 420 while being mounted on the test trays, and the DUT 90 and the socket 420 are electrically connected via the test carrier 1. In this condition, the tester 500 executes the test of the DUT 90 via the test head 400.

Then, when this test is completed, after the test carrier 1 is taken out from the test tray, the test carrier 1 is conveyed to the clean room. Then, the test carrier 1 is disassembled, and the DUT 90 is taken out from the test carrier 1. The tested DUT 90 is conveyed to the next step, and the test carrier 1 from which the DUT 90 has been taken out is reused for testing of another DUT 90.

As the test tray, it is possible to use the one that is used for the packaged existing device (DUT). Although not particularly illustrated, the test tray includes a frame and a plurality of inserts held by the frame. The test carrier 1 is accommodated in this insert. Here, the outer shape of the test carrier 1 is matched with the outer shape of the existing device, and thereby it is possible to mount the test carrier 1 on an existing test tray and to convey the test carrier 1. As the test tray and the insert, for example, it is possible to use known ones described in WO 2003/075024 and WO 2009/069189 and the like.

Next, a configuration of the test carrier 1 in one or more embodiments will be described below with reference to FIG. 3 to FIG. 9.

Figure 3:
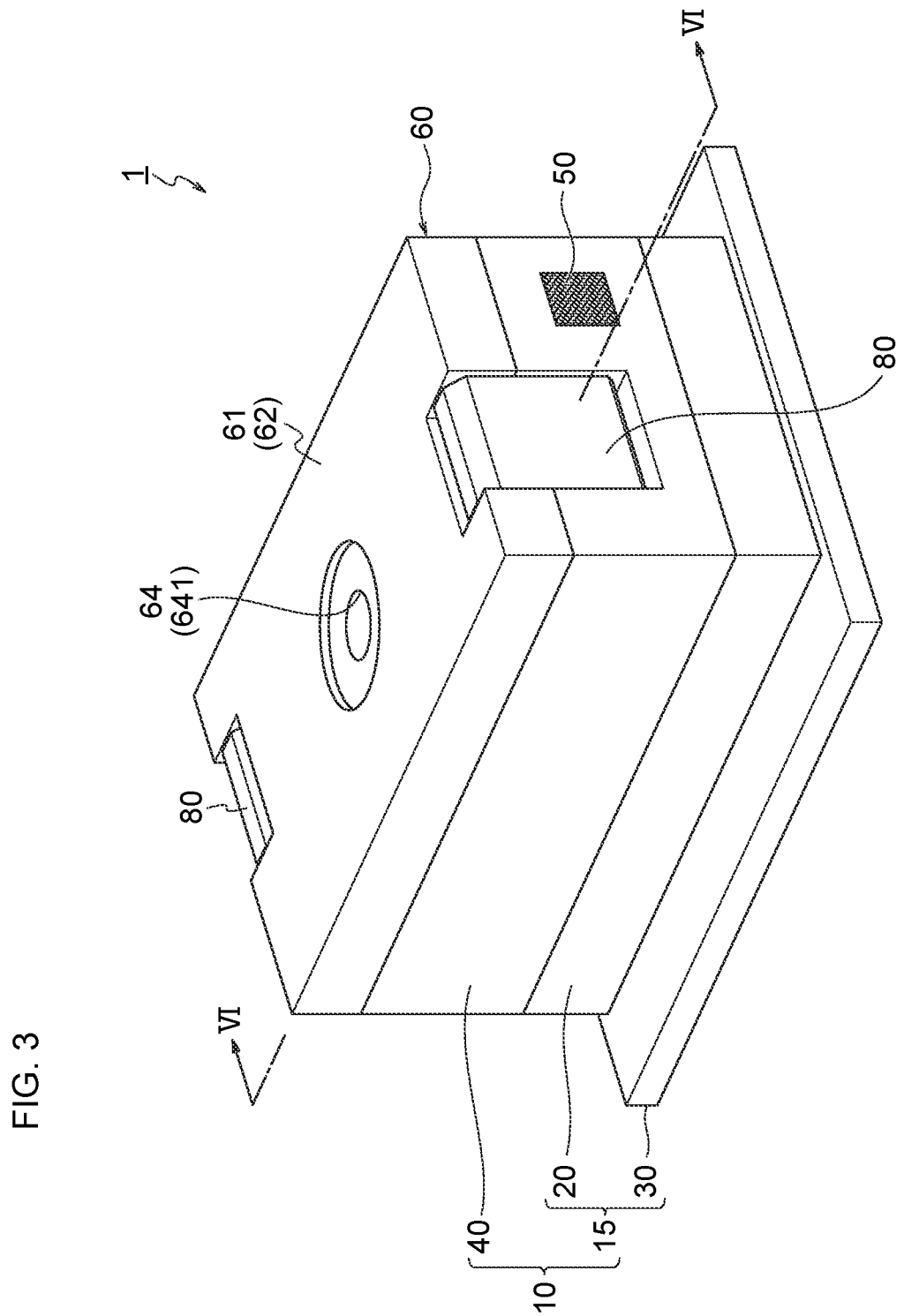
FIG. 3 is a perspective view of a test carrier in one or more embodiments of the invention viewed from above.
Figure 4:
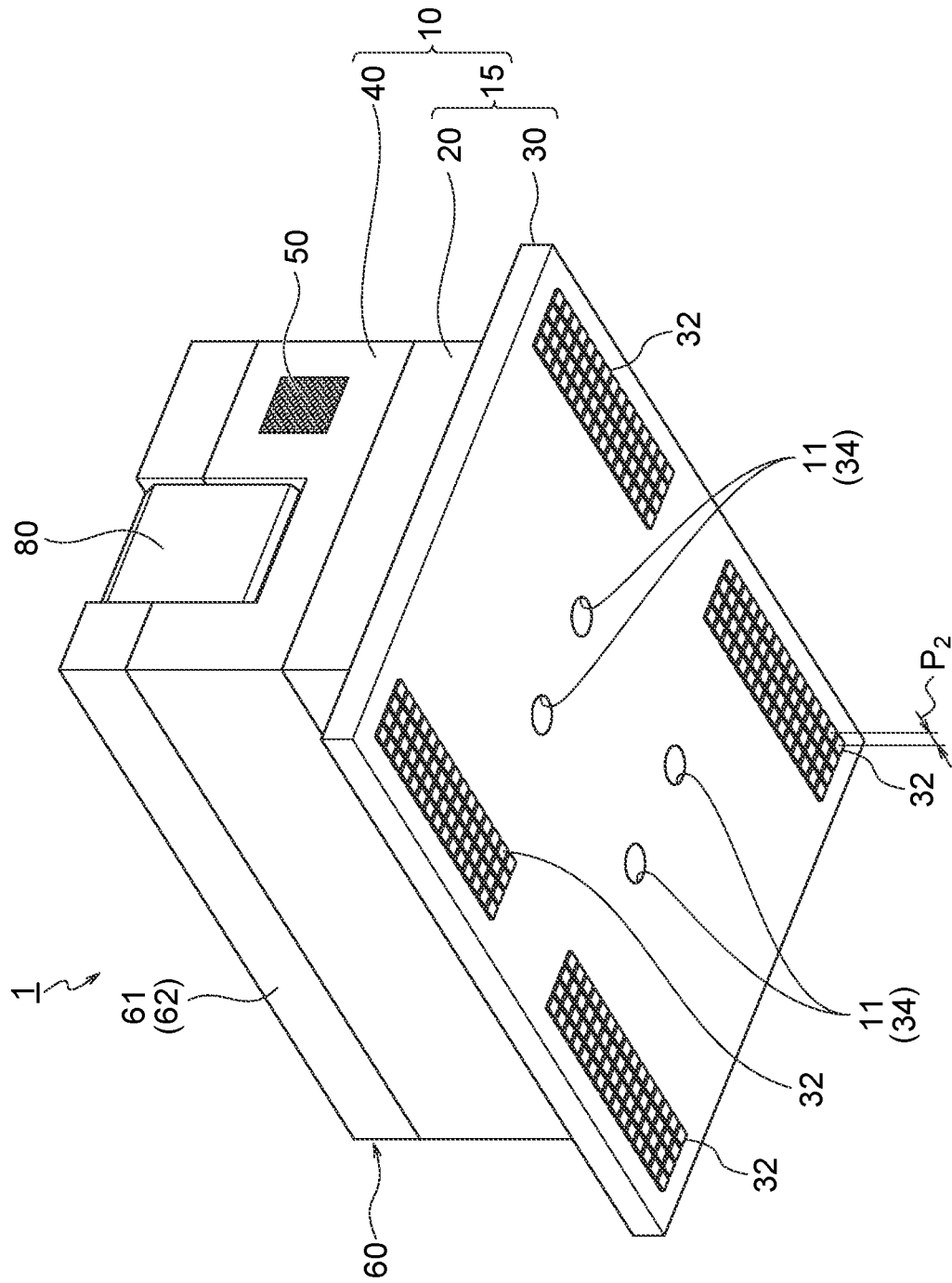
FIG. 4 is a perspective view of the test carrier in one or more embodiments of the invention viewed from below.
Figure 5:
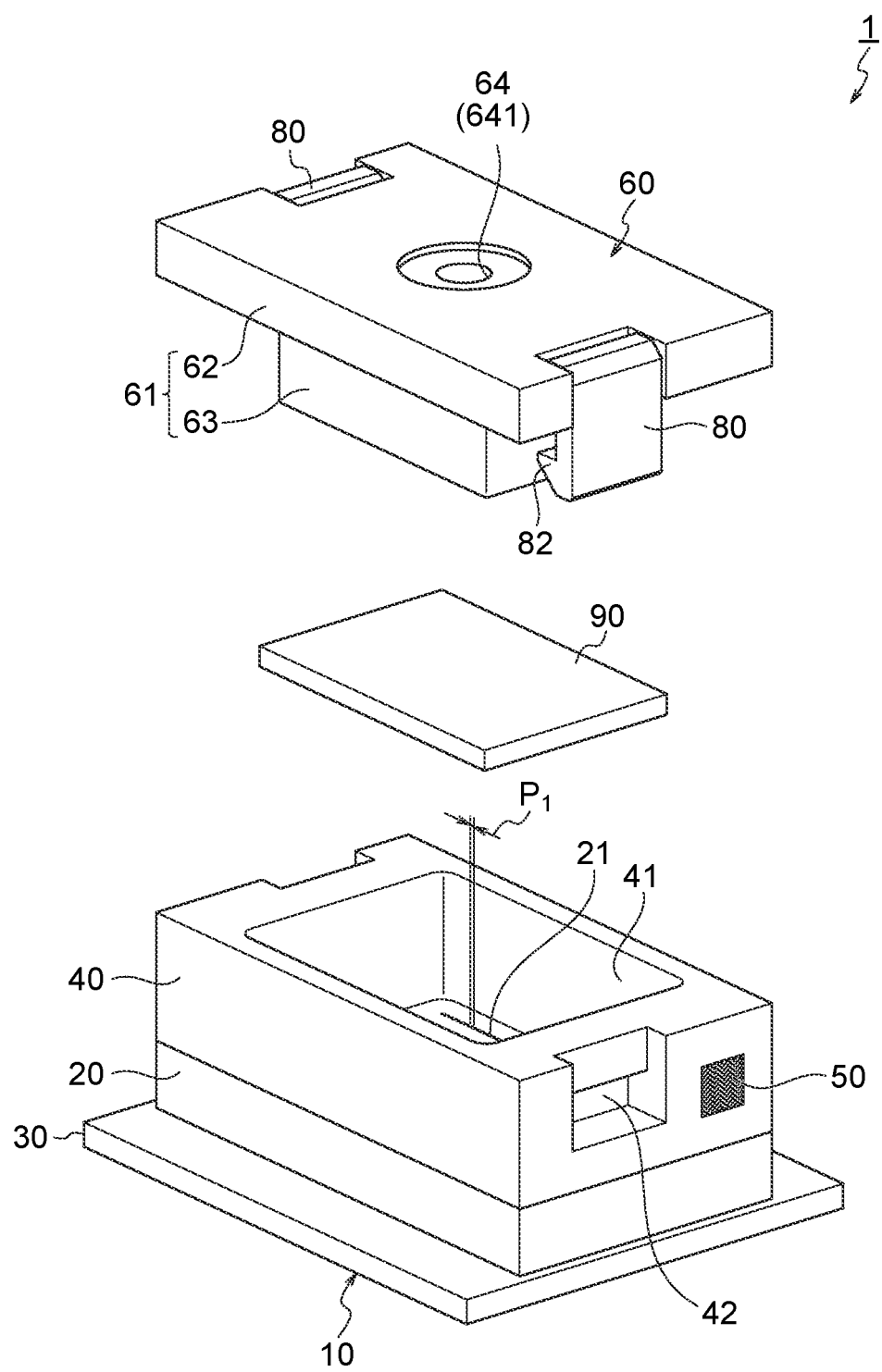
FIG. 5 is an exploded perspective view of the test carrier in one or more embodiments of the invention.
Figure 6:
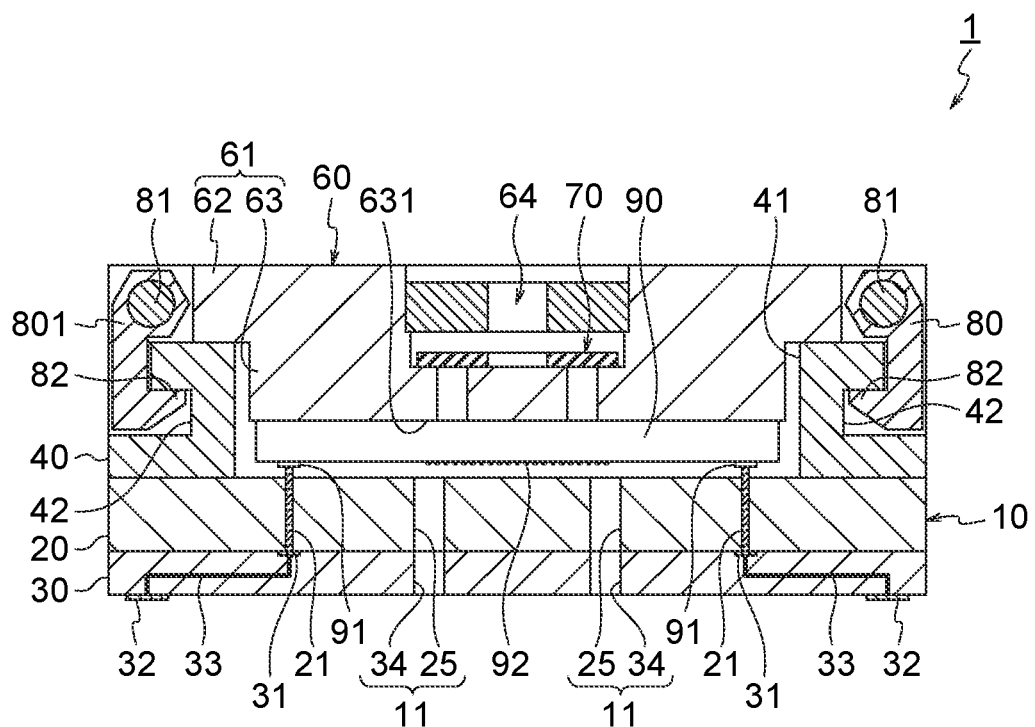
FIG. 6 is a cross-sectional view illustrating the test carrier in one or more embodiments of the invention and is a diagram taken along VI-VI line of FIG. 3.
Figure 7:
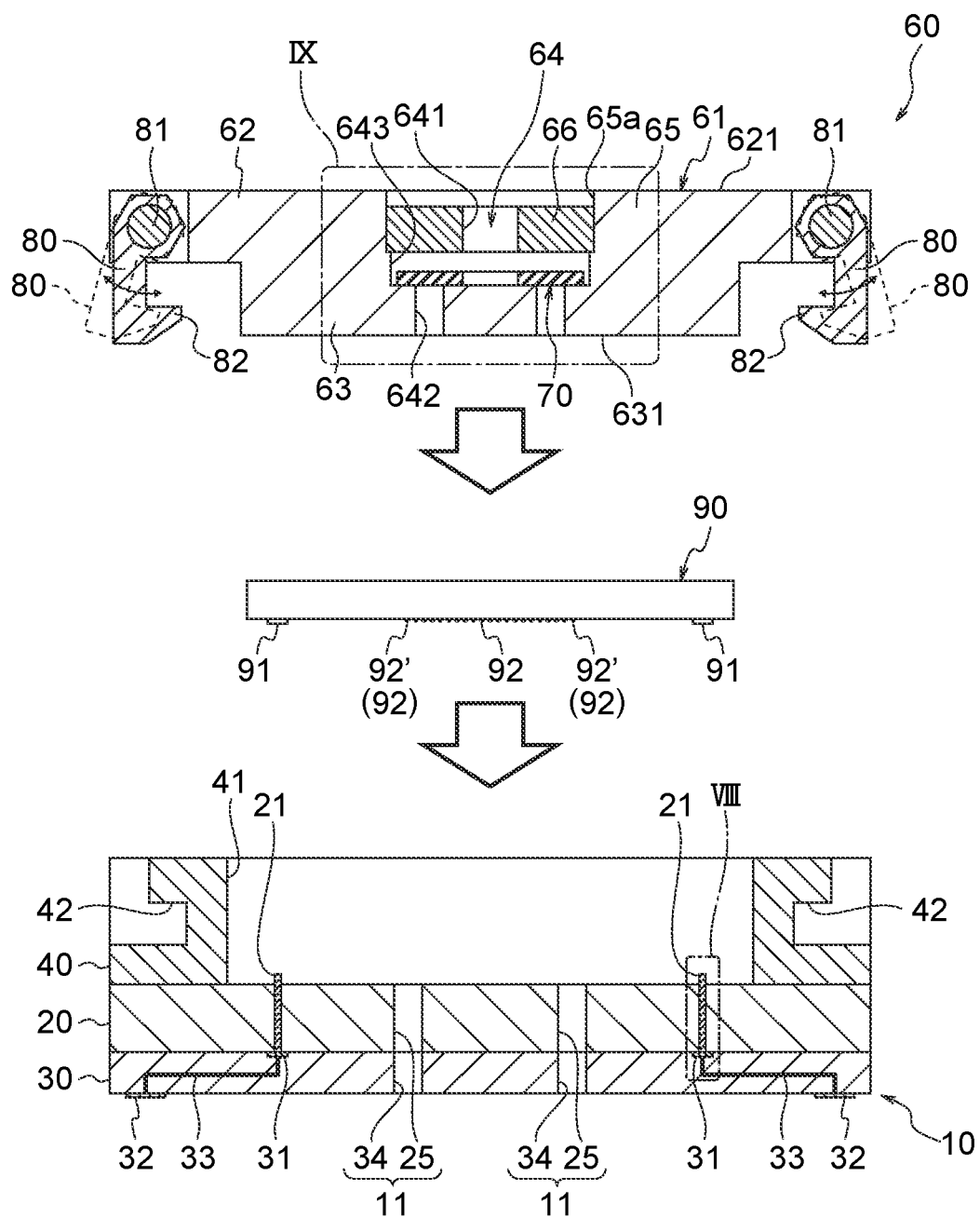
FIG. 7 is an exploded cross-sectional view illustrating the test carrier in one or more embodiments of the invention and is a diagram that corresponds to FIG. 6.
Figure 8:
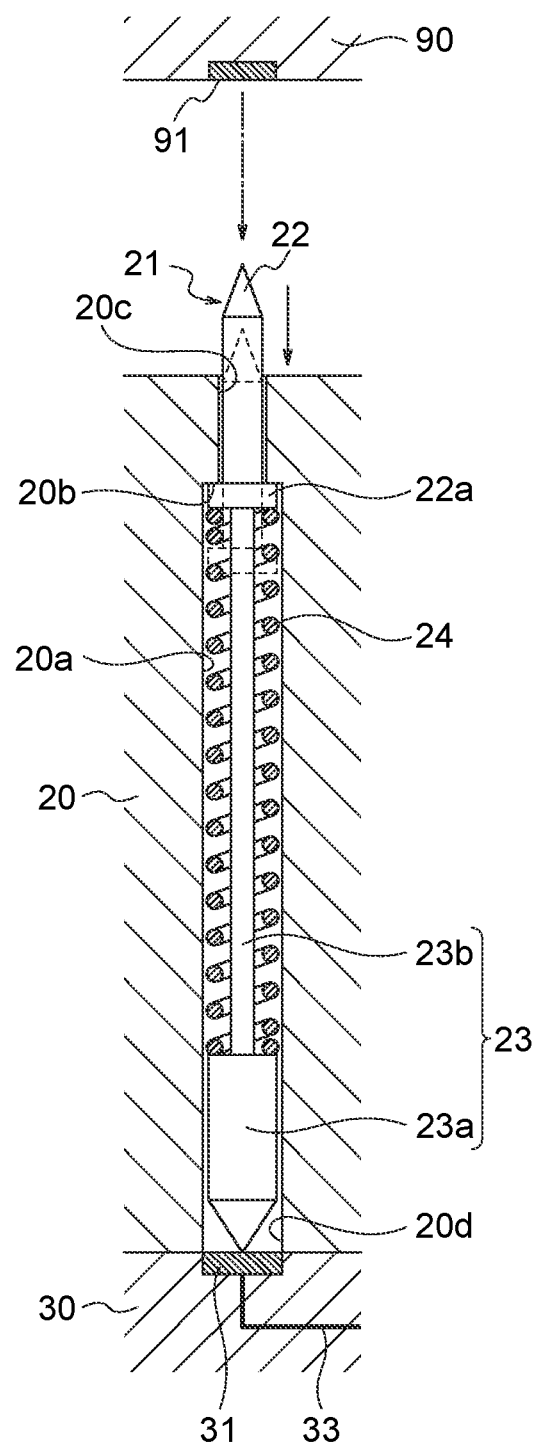
FIG. 8 is a cross-sectional view illustrating a pogo pin of the test carrier in one or more embodiments of the invention and is an enlarged view of a portion VIII of FIG. 7.
Figure 9:
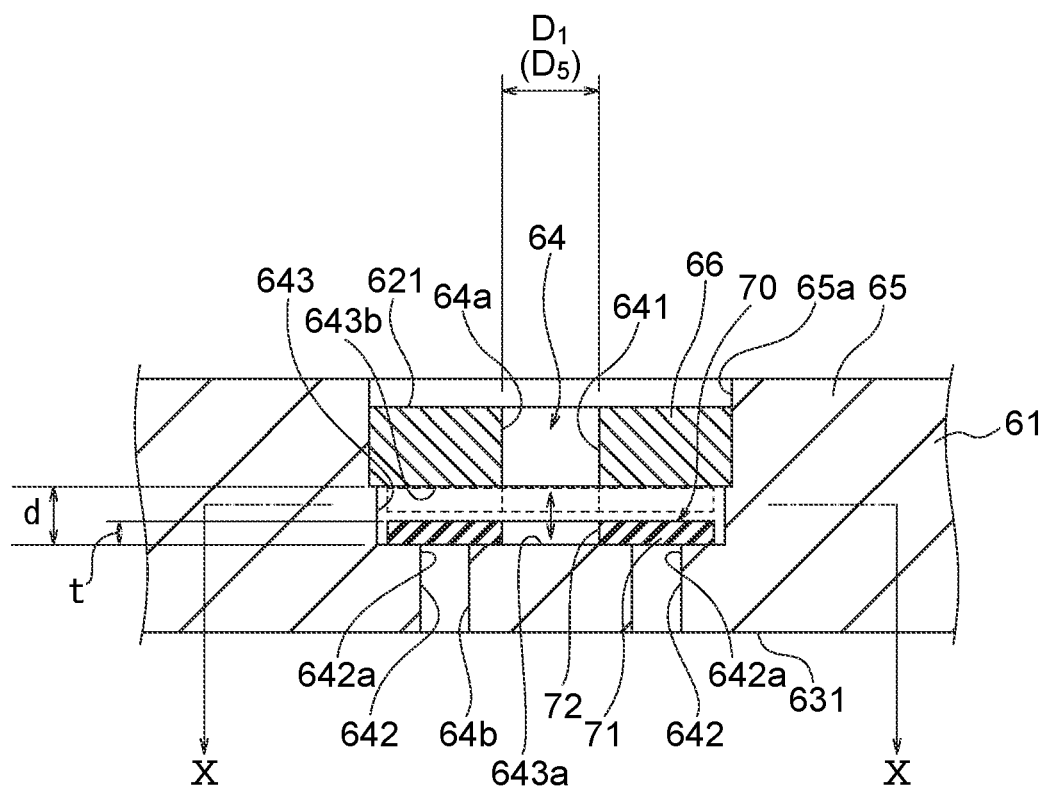
FIG. 9 is an enlarged view of a portion IX of FIG. 7.
Figure 10:
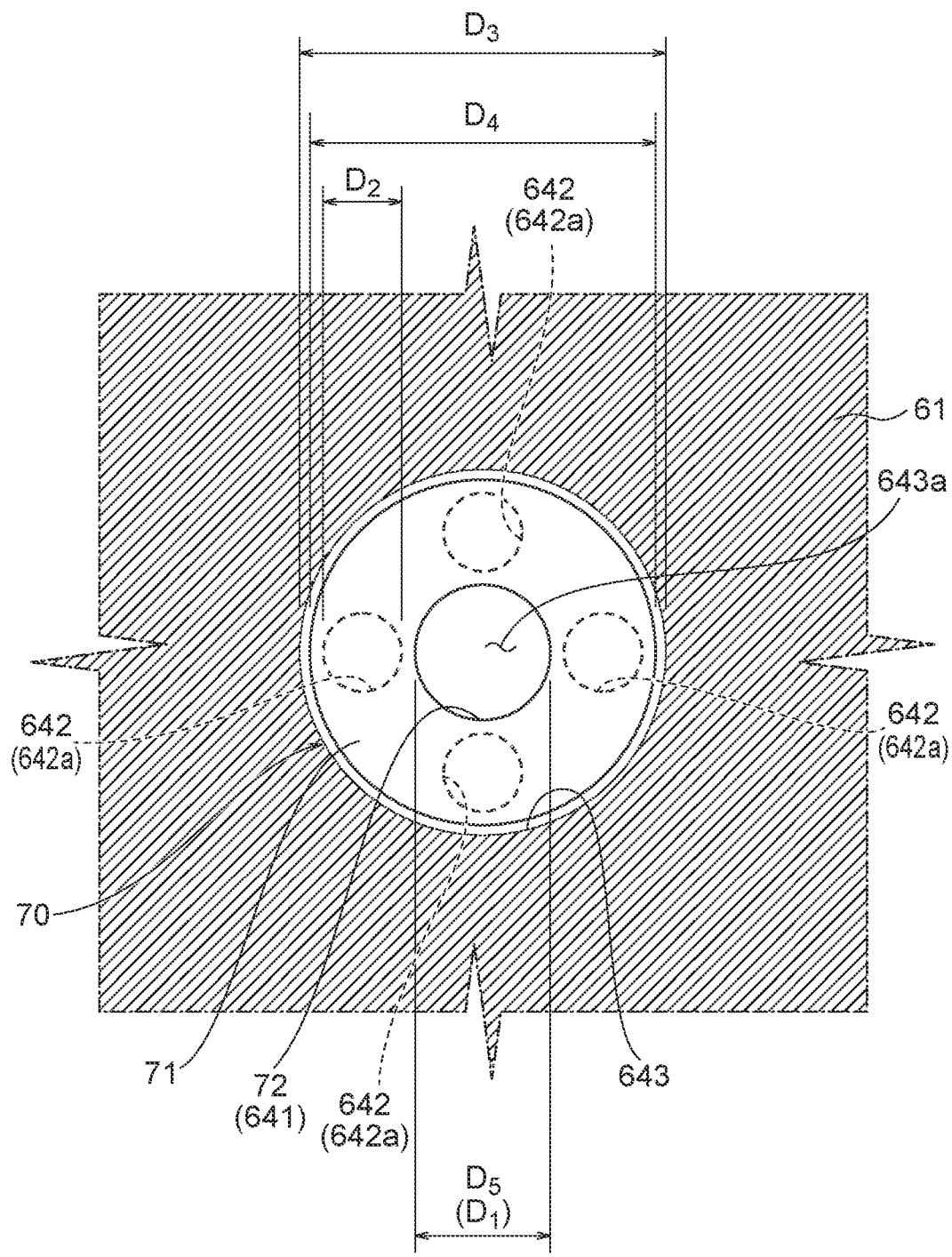
FIG. 10 is a view illustrating a through hole for sucking and holding and a movable valve in one or more embodiments of the present invention and is a cross-sectional view taken along X-X line of FIG. 9.

FIG. 3 and FIG. 4 are perspective views illustrating the test carrier 1 in one or more embodiments, FIG. 5 is an exploded perspective view of the test carrier 1 in one or more embodiments. FIG. 6 is a cross-sectional view illustrating the test carrier 1 in one or more embodiments and is a diagram taken along VI-VI line of FIG. 3. FIG. 7 is an exploded cross-sectional view illustrating the test carrier 1 in one or more embodiments and is a diagram that corresponds to FIG. 6. FIG. 8 is a cross-sectional view illustrating a pogo pin 21 of the test carrier 1 in one or more embodiments and is an enlarged view of a portion VIII of FIG. 7. FIG. 9 is an enlarged view of a portion IX of FIG. 7. FIG. 10 is a view illustrating a through hole 64 for sucking and holding and a movable valve 70 in one or more embodiments and is a cross-sectional view taken along X-X line of FIG. 9.

As illustrated in FIG. 3 to FIG. 7, the test carrier 1 in one or more embodiments includes a holding member (i.e., a holder) 10 that holds the DUT 90 and a lid member 60 (i.e., a lid) that covers the DUT 90 and is attached to the holding member 10. In this test carrier 1, by sandwiching the DUT 90 between the holding member 10 and the lid member 60, the DUT 90 is accommodated in the test carrier 1. The test carrier 1 has basically the same configuration as that of the carrier described in JP 2019-197012 A except for the through hole 64 of the lid member 60 and the movable valve 70.

The holding member 10 includes a holding body 15 and a tubular body 40 attached to the holding body 15. The holding body 15 includes a holding plate 20 and an interposer 30. The holding body 15 holds pogo pins 21 (described later) and external terminals 32 (described later).

The holding plate 20 holds the plurality of pogo pins 21. The pogo pins 21 are arranged at a pitch $P_1$ (see FIG. 5) to face the pads 91 of the DUT 90. As illustrated in FIG. 8, each of the pogo pins 21 includes a plunger 22, a fixing portion 23, and a coil spring 24. The pogo pin 21 corresponds to an example of the "contactor" in one or more embodiments of the present invention.

Each of the pogo pins 21 is inserted into a holding hole 20a of the holding plate 20. Further, a flange 22a of the plunger 22 is engaged with a step 20b of the holding hole 20a, thereby an upper limit position of the plunger 22 is restricted. At this upper limit position, a distal end of the plunger 22 protrudes from an opening 20c on an upper side of the holding hole 20a. The fixing portion 23 includes a rear end 23a positioned in the opposite opening 20d of the holding hole 20a and a shaft portion 23b extending from the rear end 23a toward the distal end (upward). The shaft portion 23b is inserted into the coil spring 24, and the coil spring 24 is interposed between the flange 22a of the plunger 22 and the rear end 23a of the fixing portion 23. When the DUT 90 is accommodated in the test carrier 1, the plunger 22 comes into contact with the pad 91 of the DUT 90, the plunger 22 presses the pad 91 by an elastic force of the coil spring 24, and the DUT 90 is held by the pogo pin 21.

In addition, as shown in FIG. 6 and FIG. 7, four openings 25 penetrating the holding plate 20 are formed in the holding plate 20. Each of the openings 25 is disposed to face a bump 92 positioned at a corner (hereinafter also simply referred to as a "bump 92") among the plurality of bumps 92 arranged in the rectangular shape on a lower surface of the DUT 90 (see FIG. 2 and FIG. 17A to FIG. 17C). In one or more embodiments, at the time of assembling the test carrier 1, this bump 92' is used as a feature point for positioning of the DUT 90 with respect to the test carrier 1.

The interposer 30 is stacked on the lower surface of the holding plate 20 and fixed to the holding plate 20 by thread fastening, etc. As illustrated in FIG. 4 and FIG. 6 to FIG. 8, the interposer 30 includes internal terminals 31, external terminals 32, and wiring patterns 33.

The internal terminals 31 are provided on an upper surface of the interposer 30. The internal terminals 31 are arranged at a pitch $P_1$ to face the pogo pins 21 held by the holding plate 20, and the fixing portions 23 of the pogo pins 21 are in contact with the internal terminals 31.

The external terminals 32 are provided on a lower surface of the interposer 30 and are exposed to the outside of the test carrier 1. The external terminals 32 are terminals to which contact pins (not illustrated) of a socket 420 of the electronic component testing apparatus 200 are electrically connected during testing of the DUT 90, and the external terminals 32 are arranged at a wider pitch $P_2$ (see FIG. 4) than the pitch $P_1$ of the internal terminals 31 ($P_2 > P_1$). The internal terminal 31 and the external terminal 32 are connected by the wiring pattern 33.

In addition, as illustrated in FIG. 4, FIG. 6, and FIG. 7, four openings 34 penetrating the interposer 30 are formed in the interposer 30. Each of openings 34 is disposed to be substantially coincident with the opening 25 of the holding plate 20 described above. Therefore, through holes 11 linearly penetrating the holding member 10 are formed by the openings 25 and 34. The through holes 11 are used to position the DUT 90, and a part (specifically, the bump 92') of the DUT 90 can be seen from the outside through the through holes 11. As will be described later, the through holes 11 are used to position the DUT 90 with high accuracy relative to the test carrier 1 when the test carrier 1 is assembled.

Figure 11:
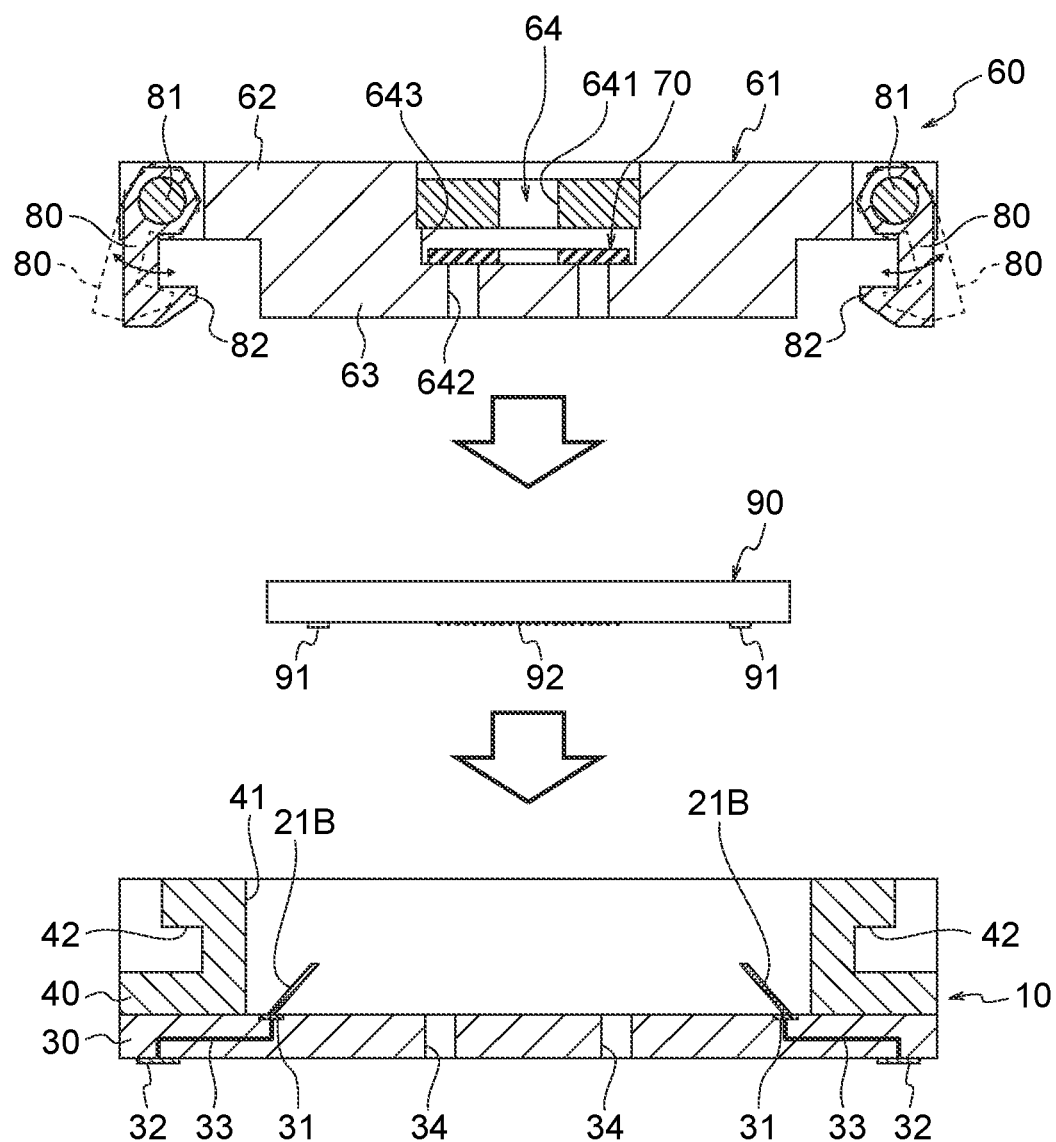
FIG. 11 is an exploded cross-sectional view illustrating a modification of a holding member of the test carrier in one or more embodiments of the present invention.

In one or more embodiments, the pogo pin 21 is used as a contactor to be in contact with the pad 91 of the DUT 90, however a contactor other than the pogo pin 21 may be used as a contactor. For example, as shown in FIG. 11, a cantilever-type probe needle 21B may be used as a contactor. FIG. 11 is an exploded cross-sectional view illustrating a modification of the holding member of the test carrier in one or more embodiments.

The probe needle 21B is mounted on the interposer 30 and is electrically connected to the inner terminal 31 of the interposer 30. Alternatively, although not particularly illustrated, an anisotropic conductive rubber sheet or a membrane type in which a bump is formed on an insulating film may be used as a contactor of the test carrier 1.

When the pogo pin 21 is used as a contactor, as described above, the holding body 15 includes the holding plate 20 for holding the pogo pin 21. On the other hand, as shown in FIG. 11, when the probe needle 21B is used as a contactor, the holding body 15 may include only the interposer 30. In this modification, the interposer 30 corresponds to an example of the "holding body" in one or more embodiments of the present invention, and the probe needle 21B corresponds to an example of the "contactor" in one or more embodiments of the present invention.

Returning to FIG. 3 to FIG. 7, the tubular body 40 is provided on the upper surface of the holding plate 20 and is fixed to the holding plate 20 by thread fastening, etc. The tubular body 40 has a rectangular tubular shape having an inner hole 41 larger than the outer shape of the DUT 90 and can surround a periphery of the DUT 90 held by the holding plate 20. Recesses 42 are formed on both side surfaces of the tubular body 40 to correspond to a latch 80 (described below) of the lid member 60. The latch 80 is engaged with the recess 42, thereby the lid member 60 is detachably attached to the holding member 10.

In addition, a two-dimensional (2D) barcode 50 is stuck on the side surface of the tubular body 40. The 2D barcode 50 represents an identification (ID) of the test carrier 1 and is used to identify an individual of the test carrier 1. In one or more embodiments, as described below, the 2D barcode 50 is used to take an error unique to the individual test carrier 1 into consideration when the DUT 90 is positioned with respect to the test carrier 1 by the carrier assembling apparatus 100. Means representing the ID of the test carrier 1 is not particularly limited to the 2D barcode as long as the means is an identifier capable of identifying the individual of the test carrier 1.

Use of the 2D barcode 50 is not particularly limited to the above description. For example, the 2D barcode 50 may be associated with an electrical resistance value of the test carrier 1 on a database. Alternatively, the 2D barcode 50 may be associated with the DUT 90 itself or a test result of the DUT 90 on the database. Therefore, a user can collate the test carrier 1 used for the test of the DUT 90, and it is possible to ensure excellent traceability (device tracking) of the DUT 90. In addition, in a case where a defective DUT 90 frequently occurs in a specific test carrier 1, it is possible to detect a defect of the test carrier 1 itself.

The lid member 60 includes a lid body 61, a movable valve 70 and a pair of latches 80. The lid body 61 includes a plate-like base part 62 and a convex part 63 protruding downward from the base part 62 in a convex shape. The movable valve 70 is disposed in a through hole 64 for sucking and holding the DUT 90 (described later) formed in the lid body 61. The latches 80 protrude downward from both ends of the base part 62.

The convex part 63 has a contact surface 631 that comes into contact with an upper surface of the DUT 90 held by the holding plate 20 to press the DUT 90. A pressing amount of the DUT 90 by the convex part 63 is limited by the tubular body 40 of the holding member 10 abutting against the base part 62 of the lid member 60. In this state, a pressing force of the pogo pin 21 with respect to the pad 91 of the DUT 90 is set to an optimum value. The DUT 90 that is accommodated in the test carrier 1 is sandwiched between the contact surface 631 of the convex part 63 and the pogo pins 21.

A through hole 64 is formed at the substantially center of the lid main body 61, and the through hole 64 penetrates the base part 62 and the convex part 63. The through hole 64 has one upper opening 64a, and the upper opening 64a is opened to the upper surface 621 of the base part 62. The upper opening 64a is disposed at the center of the upper surface 621 of the base part 62. The through hole 64 has four lower openings 64b, and the four lower openings 64b are opened to the contact surface 631 of the convex part 63. The four lower openings 64b are circumferentially arranged at equal intervals so as to surround the center of the contact surface 631 of the convex part 63. The through hole 64 is used for sucking and holding the DUT 90 by the carrier assembling apparatus 100 as will be described later.

The through hole 64 corresponds to an example of the "through hole for sucking and holding the DUT" in one or more embodiments of the present invention. The lower opening 64b corresponds to an example of the "first opening" in one or more embodiments of the present invention, and the upper opening 64a corresponds to an example of the "second opening" in one or more embodiments of the present invention.

As shown in FIG. 9 and FIG. 10, the through hole 64 for sucking and holding the DUT 90 includes a first hole part 641, a plurality of (four in this example) second hole parts 642, and an accommodating part (i.e., an accommodating chamber) 643. The number of the first hole part 641 included in the through hole 64 is not particularly limited to the above, and the through hole 64 may include a plurality of the first hole parts 641. Similarly, the number of the second hole part 642 included in the through holes 64 is not particularly limited to the above, and the through hole 64 may include one second hole part 642.

The first hole part 641 has a circular cross-sectional shape of the inner diameter $D_1$ and is a hole portion extending linearly along the vertical direction (Z direction in the drawing). The first hole part 641 forms an upper portion of the through hole 64, and the above-mentioned upper opening 64a is located at an upper end of the first hole part 641.

Each of the second hole parts 642 has a circular cross-sectional shape of the inner diameter $D_2$ and is a hole portion extending linearly along the vertical direction (Z direction in the drawing). The second hole part 642 forms a lower portion of the through hole 64, and the above-mentioned lower opening 64b is located at a lower end of the second hole part 642.

The accommodating part 643 is a space having a circular cross-sectional shape of the inner diameter $D_3$ and forms a central portion of the through hole 64. The accommodating part 643 is interposed between the first hole part 641 and the second hole part 642. The first hole part 641 is connected to the accommodating part 643 from the upper side. All four second hole parts 642 are also connected to the accommodating part 643 from the lower side. Accordingly, the first hole part 641 and each of the second hole parts 642 are connected to each other via the accommodating part 643.

Then, the inner diameter $D_1$ of the first hole part 641 is smaller than the inner diameter $D_3$ of the accommodating part 643 ($D_1 < D_3$). As shown in FIG. 10, in a transmission plan view (when seen through the lid member 60 along the normal direction (Z direction in the drawing) of the lid member 60), the first hole part 641 and the accommodating part 643 are arranged coaxially.

Further, the inner diameter $D_2$ of the respective second hole part 642 is smaller than the inner diameter $D_1$ of the first hole part 641 ($D_2<D_1$), the first hole part 641 and the plurality of second hole part 642, in a transparent plane view, are arranged so as not to overlap with each other. Although not particularly limited, in one or more embodiments, as shown in FIG. 10, four second hole parts 642 are arranged in a circle at equal intervals so as to surround the first hole part 641. Incidentally, the relationship between the inner diameter $D_1$ of the first hole part 641 and the inner diameter $D_2$ of the second hole part 642 is not particularly limited to the above, the inner diameter $D_2$ of the second hole part 642 may be the same as the inner diameter $D_1$ of the first hole part 641 ($D_2=D_1$), the inner diameter $D_2$ of the second hole part 642 may be larger than the inner diameter $D_1$ of the first hole part 641 ($D_2>D_1$).

The inner diameter $D_3$ of the accommodating part 643 is larger than the inner diameter $D_2$ of the second hole part 642 ($D_3>D_2$). In one or more embodiments, the inner diameter $D_3$ of the accommodating part 643 is larger than the circumscribed circle of the four second hole parts 642 arranged in the circle described above. Therefore, as shown in FIG. 10, the accommodating part 643 is arranged so that the accommodating part 643 includes all the second hole parts 642 in a transmission plan view, and all the second hole parts 642 are connected to the accommodating part 643.

As shown in FIG. 9 and FIG. 10, the movable valve 70 is a ring-shaped member having an outer diameter $D_4$ and includes an opening 72 and a valve body 71 in which the opening 72 is formed at the center. The movable valve 70 is made of, for example, a metal material or a resin material and has rigidity that does not deform even when the through hole 64 is sucked by the carrier assembling apparatus 100. The opening 72 of the movable valve 70 corresponds to an example of the "fourth opening" in one or more embodiments of the present invention. If the movable valve 70 can move in the accommodating part 643 by suction of the through hole 64, the movable valve 70 may be made of an elastic material.

The movable valve 70 is accommodated in the accommodating part 643 of the through hole 64 of the lid body 61. The outer diameter $D_4$ of the movable valve 70 is smaller than the inner diameter $D_3$ of the accommodating part 643 ($D_4<D_3$). Further, the thickness t of the movable valves 70 is smaller than the depth d of the accommodating part 643 ($t<d$). The movable valves 70 are not fixed to the lid body 61. Further, the outer diameter $D_4$ of the movable valve 70 is larger than the inner diameter $D_1$ of the first hole part 641 ($D_4>D_1$) and is larger than the inner diameter $D_2$ of the second hole part 642 ($D_4>D_2$). Therefore, the movable valve 70 is allowed to move along the vertical direction (Z-axis direction in the drawing) in the accommodating part 643 and is allowed to move between the first hole part 641 and the second hole part 642 in the accommodating part 643.

As shown in FIG. 10, in a transmission plan view, the opening 72 of the movable valve 70 is disposed coaxially with the first hole part 641. That is, the opening 72 is disposed so as to face the first hole part 641. The inner diameter $D_5$ of the opening 72 has substantially the same size as the inner diameter $D_1$ of the first hole part 641 ($D_5=D_1$). Therefore, even when the movable valve 70 is in contact with the upper surface 643b of the accommodating part 643 by suction of the through hole 64 by the carrier assembling apparatus 100, the first hole part 641 and the accommodating part 643 communicate with each other through the opening 72, and the first hole part 641 is not closed by the movable valve 70. Incidentally, the inner diameter $D_5$ of the opening 72 is not particularly limited to the above, as long as the valve body 71 of the movable valves 70 faces the second hole part 642, it may be smaller than the inner diameter $D_1$ of the first hole part 641 ($D_5<D_1$), it may be larger than the inner diameter $D_1$ of the first hole part 641 ($D_5>D_1$).

Further, in one or more embodiments, the outer diameter $D_4$ of the movable valves 70 is larger than the circumscribed circle of the four second hole parts 642 arranged in the circle described above. As shown in FIG. 10, similarly to the accommodating part 643, the movable valve 70 is disposed to encompass all the second hole parts 642 in a transmission plan view. Therefore, when the through hole 64 is not sucked by the carrier assembling apparatus 100, the movable valve 70 contacts the lower surface 643a of the accommodating part 643, and the upper openings 642a of all the second hole parts 642 are covered with the valve body 71 of the movable valve 70. The upper opening 642a of the second hole part 642 corresponds to an example of the "third opening" in one or more embodiments of the present invention.

In one or more embodiments, in order to form such a through hole 64 having an enlarged diameter at the middle, as shown in FIG. 7 and FIG. 9, the lid body 61 is formed from two members 65 and 66. Although not particularly limited to this, the lid body 61 may be formed of a single member.

The first member 65 is a block-shaped member in which the base part 62 and the convex part 63 are integrally formed. The second hole part 642 and the accommodating part 643 are formed at the center of the first member 65, and a concave part 65a that is larger than the accommodating part 643 is formed. The concave part 65a is disposed above the accommodating part 643 and is connected to the accommodating part 643.

On the other hand, the second member 66 is an annular member having a first hole part 641 at the center thereof. The lid body 61 having the through hole 64 is formed by inserting the second member 66 into the concave part 65a of the first member 65. In one or more embodiments, the second member 66 is fixed to the first member 65 by screwing the male screw portion formed on the outer peripheral surface of the second member 66 and the female screw portion formed on the inner peripheral surface of the concave part 65a of the first member 65. The second member 66 may be fixed to the first member using an adhesive.

Figure 12:
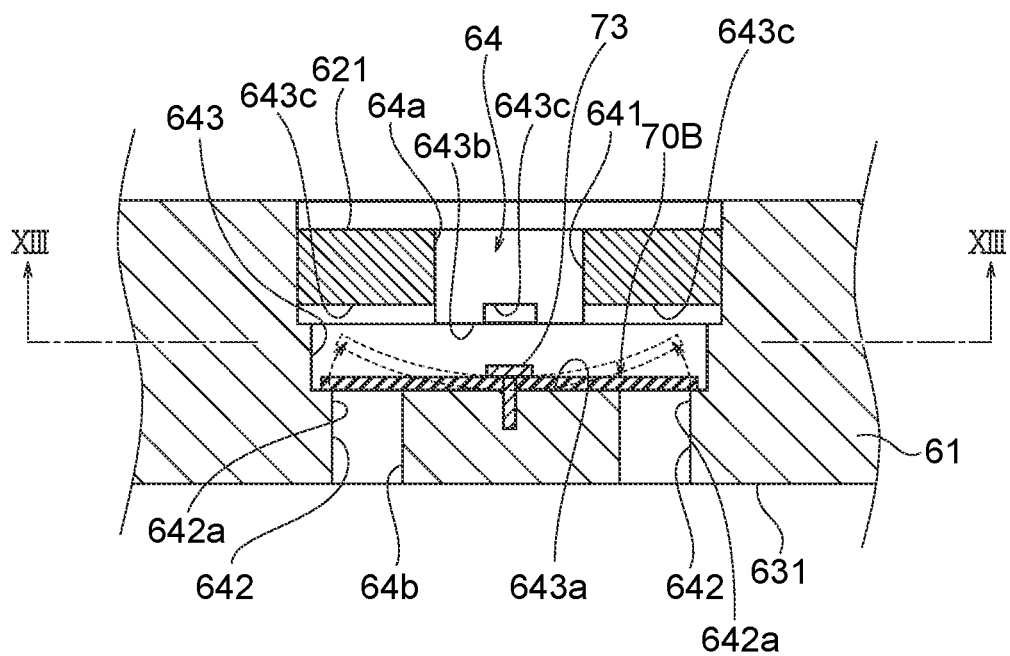
FIG. 12 is a cross-sectional view illustrating a modification of a lid member of the test carrier in one or more embodiments of the present invention.
Figure 13:
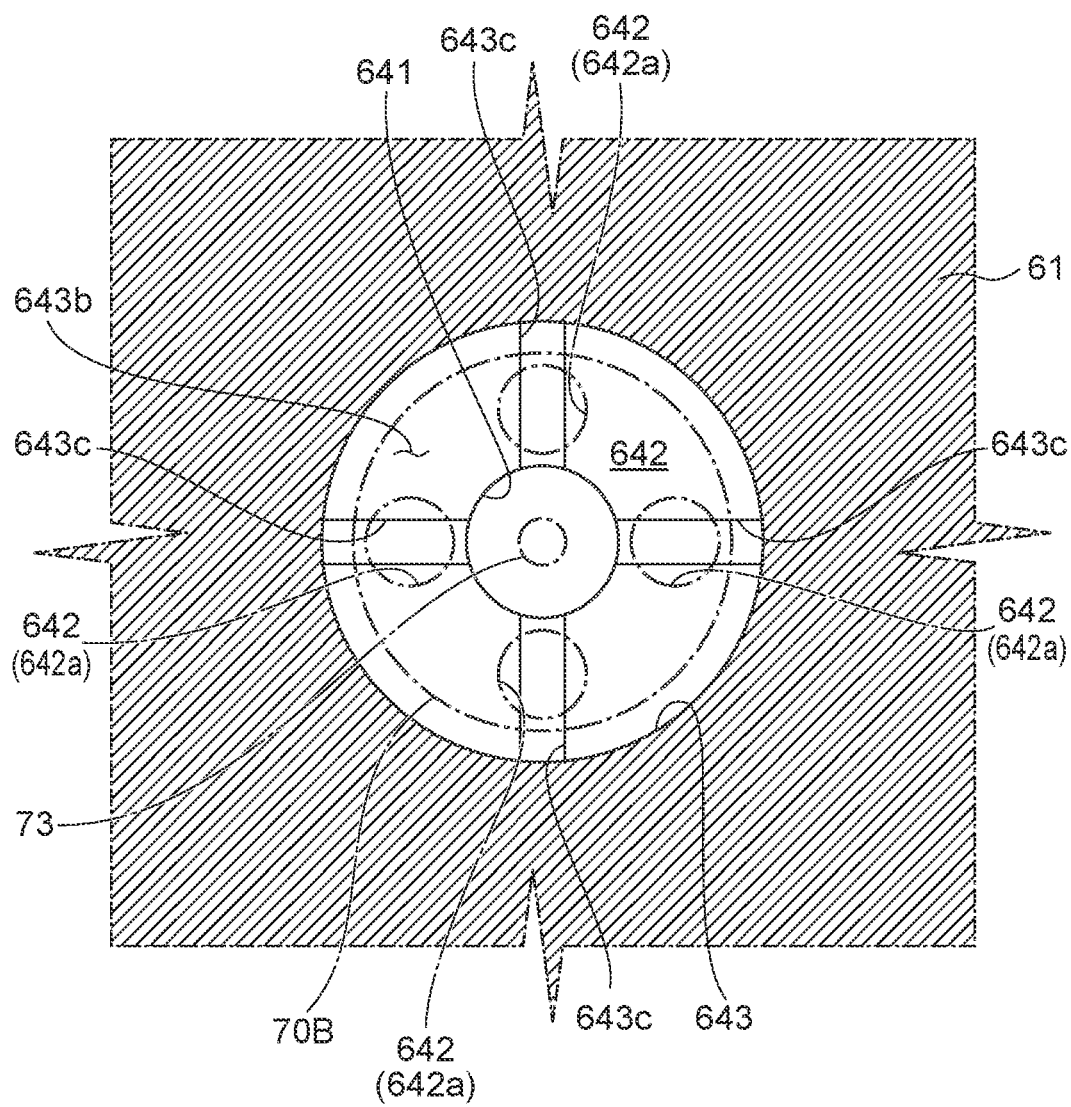
FIG. 13 is a diagram illustrating the upper surface of the accommodating part in a modification of the lid member shown in FIG. 12 and is a cross-sectional view taken along XIII-XIII line of FIG. 12.

The configuration of the movable valve is not particularly limited to the above, and the movable valve may have a configuration as shown in FIG. 12 and FIG. 13. FIG. 12 is a cross-sectional view illustrating a modification of the lid member of the test carrier in one or more embodiments, FIG. 13 is a diagram illustrating the upper surface of the accommodating part in a modification of the lid member shown in FIG. 12 and is a cross-sectional view taken along XIII-XIII line of FIG. 12.

In the modification shown in FIG. 12 and FIG. 13, the movable valve 70B has a disc shape having no opening 72. The movable valve 70 is made of an elastic material such as, for example, rubber and is elastically deformable when the through hole 64 is sucked by the carrier assembling apparatus 100. The movable valve 70B is fixed to a bottom surface 643a of the accommodating part 643 by a fixing part (i.e., a fixer) 73. The fixing part 73 is located at the center of the movable valve 70B and faces the first hole part 641. Specific examples of the fixing part 73 are not particularly limited, however screw fastening and adhesion can be exemplified.

In this modification, since the movable valve 70B is not elastically deformed when the through hole 64 is not sucked by the carrier assembling apparatus 100, the movable valve 70B contacts the lower surface 643a of the accommodating part 643, and the upper openings 642a of the second hole parts 642 are covered with the movable valve 70B. On the other hand, when the through hole 64 is sucked by the carrier assembling apparatus 100, since the central portion of the movable valve 70B is fixed by the fixing part 73 and the peripheral edge portion of the movable valve 70B is elastically deformed upward, the upper opening 642a of the second hole part 642 is opened, and the first hole part 641 and the second hole part 642 communicate with each other through the accommodating part 643. At this time, since the movable valve 70B is fixed to the lower surface 643a of the accommodating part 643 at the fixing part 73 facing the first hole part 641, the first hole part 641 is not closed by the movable valve 70B.

In this modification, a plurality of (four in this example) straight grooves 643c are formed in the upper surface (ceiling surface) 643b of the accommodating part 643. The grooves 643c extend radially around the first hole part 641, and each of the grooves 643c is connected to the first hole part 641 and is disposed to face the second hole part 642 via the movable valve 70B. Thus, it is possible to suppress closing the through hole 64 due to the contact of the elastically deformed movable valve 70B to the upper surface 643b of the accommodating part 643.

Further, the configuration of the through hole for sucking and holding the DUT is not particularly limited to the above. For example, when the movable valve is a type which is elastically deformed by suction of the carrier assembling apparatus, although not shown in particular, the first hole part and the second hole part, in a transmission plan view, may be disposed to overlap with each other, or the first hole part may be omitted from the through hole for sucking and holding the DUT. Further, by making a shape of the distal end portion of the sucking and holding unit of the carrier assembling apparatus so that it is possible to surround the movable valve, the accommodating part may be omitted from the through hole for sucking and holding the DUT in addition to the first hole part.

Returning to FIG. 3 to FIG. 7, the latches 80 are rotatably supported by shafts 81 at both ends of the base part 62, and each of the latches 80 extends downward. Each of the latches 80 is urged inward by a spring (not particularly illustrated). A claw 82 protruding inward is provided at a distal end of each of the latches 80. The lid member 60 is attached to the holding member 10 by the claw 82 engaged with the recess 42 of the holding member 10.

Next, a configuration of the carrier assembling apparatus 100 that assembles the test carrier 1 described above will be described with reference to FIG. 14. FIG. 14 is a block diagram illustrating the configuration of the carrier assembling apparatus in one or more embodiments.

As illustrated in FIG. 14, the carrier assembling apparatus 100 in one or more embodiments includes a first sucking and holding unit 110, a second sucking and holding unit 120, a decompression unit 130, a driving unit 140, a camera 150, an image processing unit 160, a reader 170, a controller 180, and a storage unit 190.

The first sucking and holding unit 110 is connected to the decompression unit 130 and can suck and hold the holding member 10. The second sucking and holding unit 120 is also connected to the decompression unit 130 and can suck and hold the lid member 60. In one or more embodiments, the DUT 90 is sucked and held together with the lid member 60 by the second sucking and holding unit 120 through the through hole 64 of the lid member 60. Although not particularly limited, for example, specific examples of the first and second sucking and holding units 110 and 120 may include a suction pad. For example, examples of the decompression unit 130 may include a vacuum pump.

In one or more embodiments, the holding member 10 is held by the first sucking and holding unit 110 in a state in which the distal end of the pogo pin 21 faces upward, however not particularly limited to this, the first sucking and holding unit 110 may suck and hold the holding member 10 in a state in which the holding member 10 is inverted (that is, a state in which the distal end of the pogo pin 21 faces downward). Similarly, in one or more embodiments, the second sucking and holding unit 120 holds the lid member 60 and the DUT 90 in a state in which the pad 91 and the bump 92 face downward, however not particularly limited to this, the second sucking and holding unit 120 may suck and hold the lid member 60 and the DUT 90 in a state in which the lid member 60 and the DUT 90 are inverted (that is, a state in which the pad 91 and the bump 92 face upward).

In one or more embodiments, the driving unit 140 is connected to the second sucking and holding unit 120. The second sucking and holding unit 120 is movable in XYZ directions and rotatable in a θ direction around a Z axis by an actuator included in the driving unit 140 and is movable and rotatable relative to the first sucking and holding unit 110. The first sucking and holding unit 110 may be movable with respect to the second sucking and holding unit 120, and both the first and second sucking and holding units 110 and 120 may be movable.

The camera 150 captures an image of a part of the DUT 90 through a through hole 11 of the holding member 10 held by the first sucking and holding unit 110. Specifically, the camera 150 captures an image including the through hole 11 of the holding member 10 and the bump 92' positioned at the corner among the bumps 92 included in the DUT 90 (see FIG. 17A to FIG. 17C). Image information acquired by the camera 150 is transmitted to the image processing unit 160.

Figure 17A:
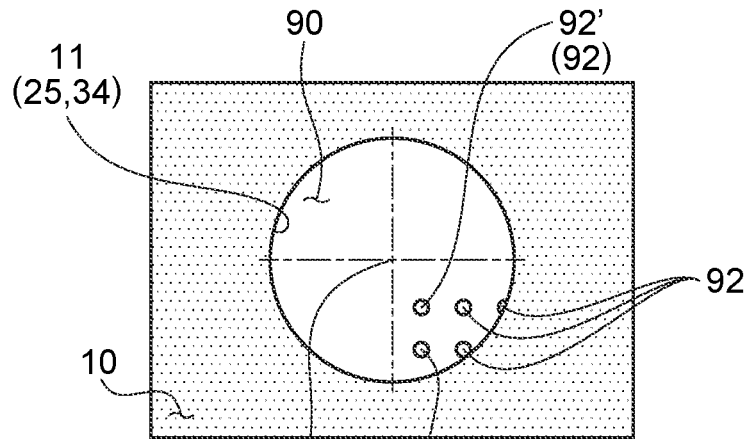
FIG. 17A to FIG. 17C are views illustrating steps S40 to S60 of FIG. 15.
Figure 17B:
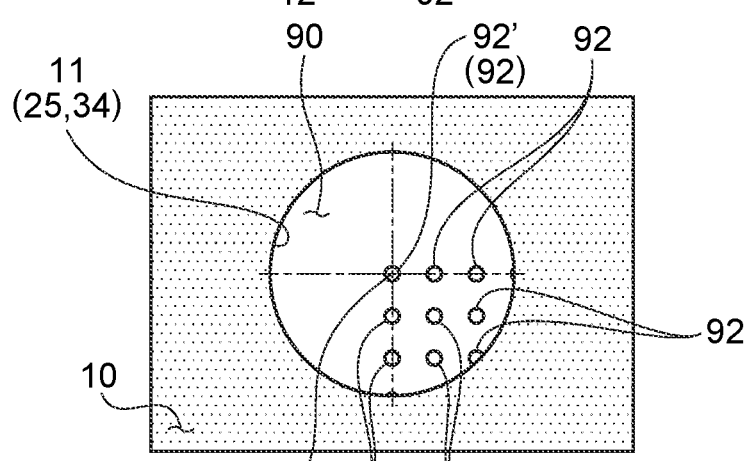
Figure 17C:
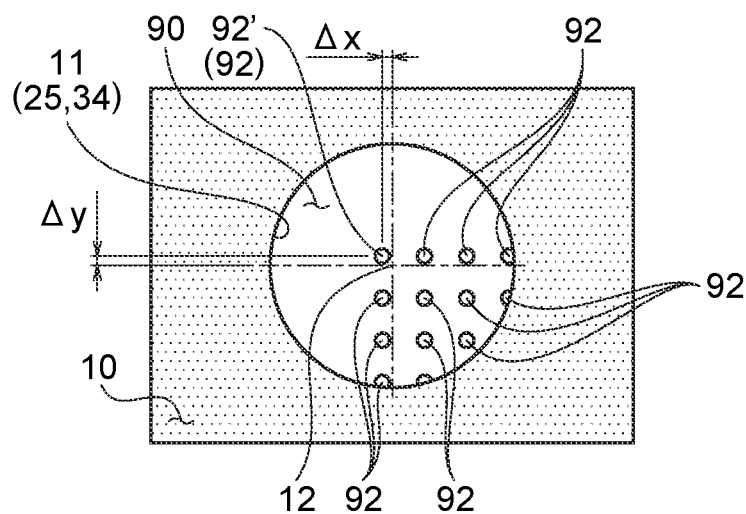

The image processing unit 160 detects a position of a center 12 of the through hole 11 and a position of the bump 92' by performing image processing on this image information and acquires a relative position of the bump 92' with respect to the center 12 of the through hole 11 (see FIG. 17A to FIG. 17C). A reference for the relative position of the bump 92' is not particularly limited to the center 12 of the through hole 11 as long as the reference corresponds to a part related to the through hole 11.

A feature point of the DUT 90 acquired by the image processing unit 160 for positioning the DUT 90 with respect to the test carrier 1 is not particularly limited to the bump 92' as long as the point corresponds to a characteristic portion in the DUT 90. Although not specifically illustrated, for example, an alignment mark for positioning may be formed on the DUT 90 and this alignment mark may be used as a feature point of the DUT 90.

The reader 170 is a barcode reader that reads the 2D barcode 50 of the holding member 10 held by the first sucking and holding unit 110. ID information read by this reader 170 is transmitted to the controller 180. The controller 180 reads a correction value corresponding to the ID information of the test carrier 1 from the storage unit 190.

A correction value table having a plurality of correction values respectively corresponding to IDs of test carriers 1 is stored in advance in the storage unit 190. Each of the correction values is a correction value corresponding to an error of a relative position of the through hole 11 with respect to the pogo pin 21, the error was generated by processing of the holding member 10, and the correction values is a value unique to each test carrier 1. Specifically, this correction value is obtained as follows. That is, first, an actual relative position $(x_1, y_1)$ of the center 12 of the through hole 11 with respect to the center of the pogo pin 21 is obtained by actually measuring the test carrier 1. Subsequently, a difference $(\Delta x, \Delta y)$ $(=x_0-x_1, y_0-y_1)$ between a design relative position $(x_0, y_0)$ of the center 12 of the through hole 11 with respect to the center of the pogo pin 21 and an actual relative position $(x_1, y_1)$ is obtained, and this difference $(\Delta x, \Delta y)$ is set as the correction value. The correction value table is configured by individually associating the correction values of the test carriers 1 with the IDs of the individual test carriers 1. Incidentally, the design relative position $(x_0, y_0)$ of the center 12 of the through hole 11 with respect to the center of the pogo pin 21 corresponds to a relative position of a center of the bump 92' with respect to the center of the pad 91 in the DUT 90 (see FIG. 2).

Further, the controller 180 controls the driving unit 140 so that the DUT 90 is positioned with respect to the holding member 10 on the basis of the relative position of the bump 92' acquired by the image processing unit 160 and the correction value described above. For example, the image processing unit 160, the controller 180, and the storage unit 190 can be realized by a computer.

Hereinafter, a procedure of accommodating the DUT 90 in the test carrier 1 using the carrier assembling apparatus 100 will be described with reference to FIG. 15 to FIG. 17C.

Figure 15:
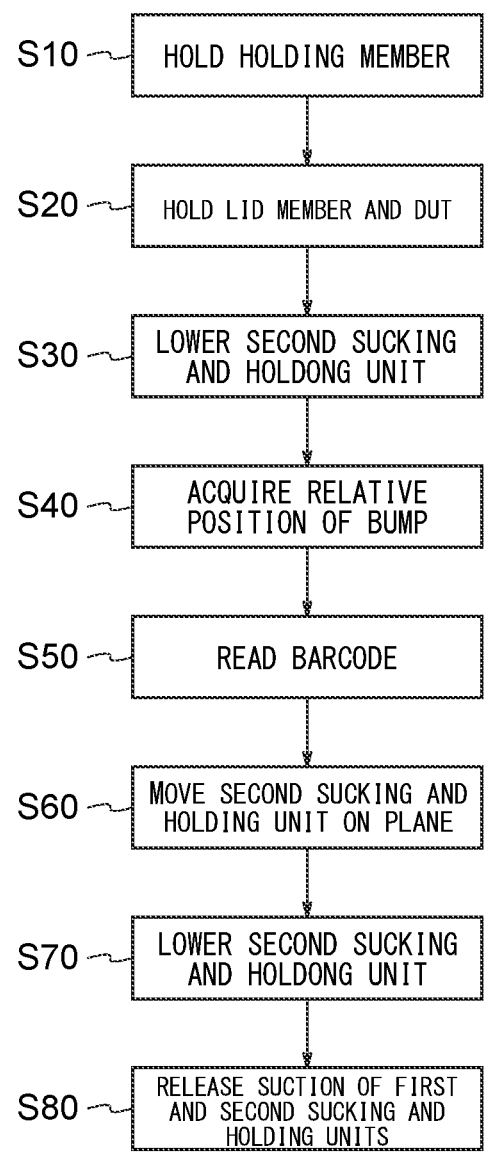
FIG. 15 is a process diagram of a method of assembling the test carrier in one or more embodiments of the invention.
Figure 16A:
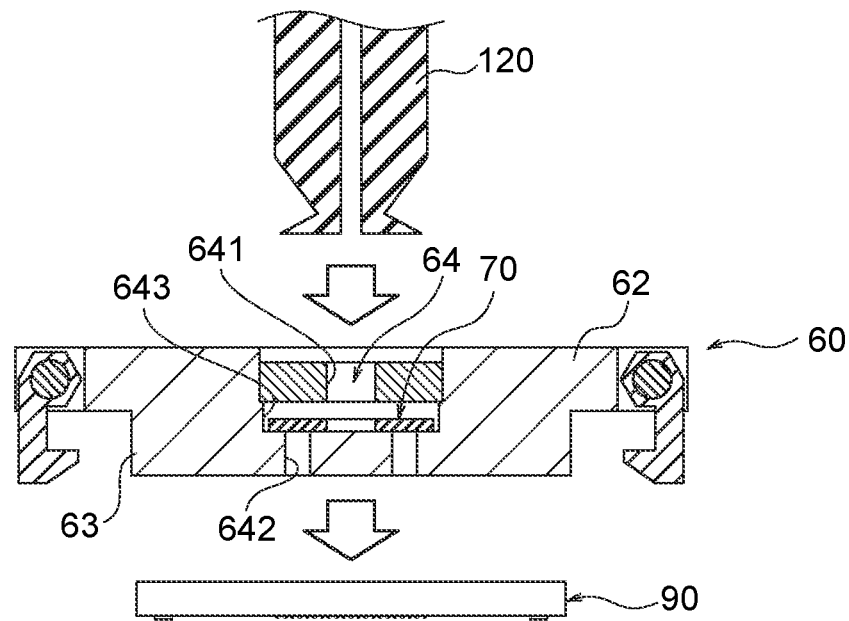
FIG. 16A and FIG. 16B are views illustrating step S20 of FIG. 15.
Figure 16B:
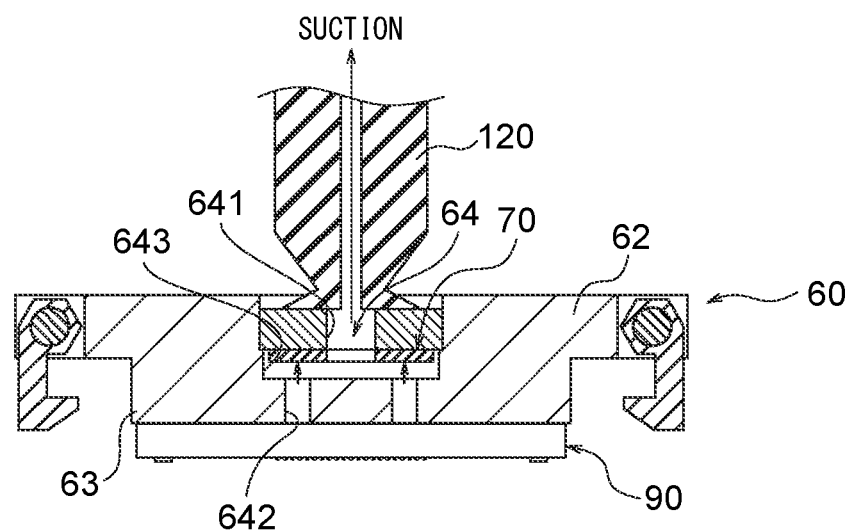

FIG. 15 is a process diagram of a method of assembling the test carrier 1 in one or more embodiments. FIG. 16A and FIG. 16B are views illustrating step S20 of FIG. 15, FIG. 16A is a diagram illustrating a state before the lid member 60 and the DUT 90 are sucked and held by the second sucking and holding unit 120, and FIG. 16B is a diagram illustrating a state in which the lid member 60 and the DUT 90 are sucked and held by the second sucking and holding unit 120. FIG. 17A to FIG. 17C are views illustrating steps S40 to S60 of FIG. 15, FIG. 17A is a diagram illustrating an image of the lower surface of the DUT 90 captured by the camera 150 through the through hole 11 before alignment, FIG. 17B is a diagram illustrating an image of the lower surface of the DUT 90 captured by the camera 150 through the through hole 11 during alignment, and FIG. 17C is a diagram illustrating an image of the lower surface of the DUT 90 captured by the camera 150 through the through hole 11 after alignment.

First, in step S10 of FIG. 15, the holding member 10 of the test carrier 1 is sucked and held by the first sucking and holding unit 110. At this time, the first sucking and holding unit 110 sucks and holds the holding member 10 from below in a state in which the distal end of the pogo pin 21 faces upward.

Subsequently, in step S20 of FIG. 15, the lid member 60 and the DUT 90 are sucked and held by the second sucking and holding unit 120. At this time, the second sucking and holding unit 120 sucks and holds the lid member 60 and the DUT 90 from above in a state in which the pad 91 and the bump 92 face downward.

Here, before the through hole 64 is sucked by the carrier assembly apparatus 100, as shown in FIG. 16A, the movable valve 70 descends in the accommodating part 643 by its own weight and contacts the lower surface 643a of the accommodating part 643, and the upper opening 642a of the second hole part 642 is covered with the valve body 71 of the movable valve 70. Therefore, in one or more embodiments, when the lid member 60 and the DUT 90 are not sucked and held by the carrier assembling apparatus 100 (that is, when the second sucking and holding unit 120 does not contact the lid member 60), since the space between the first hole part 641 and the second hole part 642 of the through hole 64 is closed by the movable valve 70, so it is possible to suppress the entry of foreign matter such as minute dust into the test carrier 1 through the through hole 64.

Then, in step S20, when the through hole 64 is sucked by the carrier assembling apparatus 100, as shown in FIG. 16B, the movable valve 70 is sucked up in the accommodating part 643 and comes into contact with the upper surface 643b of the accommodating part 643. At this time, since the first hole part 641 and the accommodating part 643 communicate with each other through the opening 72 of the movable valve 70 and the first hole part 641 is not closed by the movable valve 70, the second sucking and holding unit 120 can suck and hold the lid member 60 and the DUT 90. At this time, although the movable valve 70 does not close the through hole 64, since the second sucking and holding unit 120 is in contact with the lid member 60, the foreign matter does not enter the test carrier 1 through the through hole 64.

In addition, even if a foreign matter enters the through hole 64 and adheres to the movable valve 70 when the second sucking and holding unit 120 is not in contact with the lid member 60, the foreign matter is discharged to the outside of the test carrier 1 by the suction of the through hole 64 by the carrier assembling apparatus 100 in this step S20.

Subsequently, in step S30 of FIG. 15, the driving unit 140 lowers the second sucking and holding unit 120 along the Z axis direction to bring the pad 91 of the DUT 90 and the pogo pin 21 of the holding member 10 close to each other. Although not particularly limited, for example, in this state, an interval between the pad 91 and the pogo pin 21 is about 0.05 mm.

Subsequently, in step S40 of FIG. 15, as illustrated in FIG. 17A, an image of a part of the DUT 90 is captured by the camera 150 through the through hole 11, and image information thereof is transmitted to the image processing unit 160. From the image information, the image processing unit 160 acquires a relative position of the center of the bump 92' with respect to the center 12 of the through hole 11. The image processing unit 160 transmits the relative position of the bump 92' to the controller 180.

Subsequently, in step S50 of FIG. 15, the 2D barcode 50 assigned to the holding member 10 is read by the reader 170, and the controller 180 reads a correction value corresponding to ID information thereof from the storage unit 190.

Subsequently, in step S60 of FIG. 15, the controller 180 controls the driving unit 140 on the basis of the relative position of the bump 92' acquired by the image processing unit 160. In one or more embodiments, the controller 180 controls the driving unit 140 so that the center of the bump 92' coincides with the center 12 of the through hole 11. The driving unit 140 moves the second sucking and holding unit 120 on the XY plane in accordance with an instruction from the controller 180 so that the center of the bump 92' of the DUT 90 is located at the center 12 of the through hole 11 (See FIG. 17B).

In step S60, the controller 180 controls the driving unit 140 on the basis of the correction value read from the storage unit 190. The driving unit 140 further moves the second sucking and holding unit 120 on the XY plane in accordance with an instruction from the controller 180 so that the center of the bump 92' of the DUT 90 is separated from the center 12 of the through hole 11 by a correction amount $(\Delta x, \Delta y)$ (see FIG. 17C). Therefore, the error of each test carrier 1 is taken into consideration, so the pad 91 is highly accurately positioned with respect to the pogo pin 21.

In practice, in step S60, the control of the driving unit 140 based on the relative position of the bump 92' and the control of the driving unit 140 based on the correction value are executed at the same time. In step S60, the controller 180 may control the driving unit 140 to rotate the second sucking and holding unit 120 in the θ direction on the basis of positions of a plurality of bumps 92'.

Subsequently, in step S70 of FIG. 15, the driving unit 140 further lowers the second sucking and holding unit 120 along the Z axis direction so that the tubular body 40 of the holding member 10 abuts against the base part 62 of the lid member 60. Therefore, the pad 91 of the DUT 90 is pressed with an optimum pressing force by the pogo pin 21, and the DUT 90 is pinched by the pogo pin 21 and the lid member 60. In addition, as the second sucking and holding unit 120 is lowered by the driving unit 140, the claw 82 of the latch 80 is engaged with the recess 42 of the tubular body 40, and the lid member 60 is attached to the holding member 10.

Subsequently, in step S80 of FIG. 15, in a state in which the test carrier 1 is held by a transport device (not illustrated), suction of the first and second sucking and holding units 110 and 120 is released, and an operation of accommodating the DUT 90 in the test carrier 1 is completed.

Since the through hole 64 is not sucked when the suction of the second sucking and holding unit 120 is released, similarly to the state of FIG. 16A described above, the movable valve 70 descends by its own weight, and the upper opening 642a of the second hole part 642 is covered with the movable valve 70. Therefore, in one or more embodiments, when the lid member 60 and the DUT 90 are not sucked and held by the carrier assembling apparatus 100 (that is, when the second sucking and holding unit 120 does not contact the lid member 60), since the movable valve 70 closes the space between the first hole part 641 and the second hole part 642 of the through hole 43, it is possible to suppress the entry of foreign matter such as minute dust into the test carrier 1 through the through hole 64.

As described above, in one or more embodiments, since the test carrier 1 includes the movable valve 70 that opens and closes the through hole 64 in accordance with the suction of the through hole 64 for sucking and holding the DUT 90. Therefore, in a state where the through hole 64 is sucked, since the through hole 64 is not closed by the movable valve 70, it is possible to suck and hold the DUT 90. On the other hand, in a state where the through hole 64 is not sucked, since the through hole 64 is closed by the movable valve 70, it is possible to suppress the entry of foreign matter into the test carrier 1 through the through hole 64. Accordingly, it is possible to suppress adhesion of the foreign matter to the tested DUT 90 that is to be taken out from the test carrier 1 in the clean room, and it is possible to suppress the invasion of the foreign matter to the next process.

The above-described embodiments are used to facilitate the understanding of the invention and does not limit the invention. Thus, the components disclosed in the above-described embodiments include all modifications in design and equivalents belonging to the technical scope of the invention.

For example, the test carrier 1 may not include the through hole 11 for positioning. In this case, the DUT 90 may be positioned with respect to the test carrier 1 by obtaining an image of the pad 91 of the DUT 90 and an image of the pogo pin 21 and calculating the relative position of the DUT 90 with respect to the pogo pin 21 on the basis of these images.

Further, for example, the die is given as a specific example of the DUT 90 in the above-described embodiments. However, the DUT 90 is not particularly limited thereto. For example, the DUT 90 may be the packaged device. Further, the DUT 90 is a memory device in the above-described embodiments. However, the DUT 90 is not particularly limited thereto. For example, the DUT 90 may be a SoC (System on a chip) or a logic device.

Furthermore, the electronic component testing apparatus 200 in the above-described embodiments includes the handler 300 that presses the DUT 90 against the sockets 420 while holding DUT 90 in the test trays. However, the configuration of the handler 300 is not particularly limited thereto. For example, the handler 300 may be a type of handler that presses the DUT to a socket by an arm that sucks and holds the DUT.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

| EXPLANATIONS OF LETTERS OR NUMERALS | |
|---|---|
| 1 | TEST CARRIER |
| 10 | HOLDING MEMBER |
| 15 | HOLDING BODY |
| 21 | POGO PIN |
| 21B | PROBE NEEDLE |
| 32 | EXTERNAL TERMINAL |
| 60 | LID MEMBER |
| 61 | LID BODY |
| 62 | BASE PART |
| 621 | UPPER SURFACE |
| 63 | CONVEX PART |
| 631 | CONTACT SURFACE |
| 64 | THROUGH HOLE (THROUGH HOLE FOR SUCKING AND HOLDING DUT) |
| 64a | OPENING |
| 64b | OPENING |
| 641 | FIRST HOLE PART |
| 642 | SECOND HOLE PART |
| 642a | OPENING |
| 643 | ACCOMMODATING PART |
| 643a | LOWER SURFACE |
| 643b | UPPER SURFACE |
| 643c | GROOVE |
| 70, 70B | MOVABLE VALVE |
| 71 | VALVE BODY |
| 72 | OPENING |
| 73 | FIXING PART |
| 90 | DUT |
| 100 | CARRIER ASSEMBLING APPARATUS |
| 120 | SECOND SUCKING AND HOLDING UNIT |

The invention claimed is:

1. A test carrier that accommodates a device under test (DUT) and has a through-hole facing the DUT, the test carrier comprising:
   a movable valve that:
      opens by suction through the through hole such that the DUT is sucked through the through hole, wherein
   the movable valve moves or deforms by the suction through the through hole.

2. A test carrier that accommodates a device under test (DUT) and has a through-hole facing the DUT, the test carrier comprising:
   a movable valve that:
      opens by suction through the through hole such that the DUT is sucked through the through hole;

a holder that holds the DUT; and
a lid that covers the DUT and is detachably attached to the holder, wherein
the lid comprises a lid body, and
the through hole is formed in and penetrates the lid body.

3. The test carrier according to claim 2, wherein
the holder comprises:
contactors corresponding to terminals of the DUT;
external terminals electrically connected to the contactors; and
a holding body that holds the contactors and the external terminals.

4. The test carrier according to claim 3, wherein
the lid body has a contact surface that contacts the DUT,
the through hole has a first opening that is open at the contact surface, and
the DUT is sandwiched between the contact surface and the contactors.

5. The test carrier according to claim 4, wherein
the through hole has a second opening that is open at an opposite surface of the lid body to the contact surface, and
the second opening is opposite to the first opening.

6. A test carrier that accommodates a device under test (DUT) and has a through-hole facing the DUT, the test carrier comprising:
a movable valve that:
opens by suction through the through hole such that the DUT is sucked through the through hole, wherein
the through hole comprises:
a first hole part;
an accommodating chamber that connects to the first hole part and accommodates the movable valve in a movable or deformable state; and
a second hole part that connects to the first hole part via the accommodating chamber, and
the movable valve opens by suction through the through hole such that the first hole part and the second hole part communicate with each other.

7. The test carrier according to claim 6, wherein
the movable valve has an outer diameter larger than an inner diameter of the second hole part,
the through hole has a third opening opened to the accommodating chamber, and
without the suction through the through hole, the movable valve covers the third opening.

8. The test carrier according to claim 6, wherein
the first hole part and the second hole part do not overlap with each other in a transparent plan view.

9. The test carrier according to claim 6, wherein
the through hole comprises a plurality of second hole parts including the second hole part, and
the second hole parts are connected to the first hole part via the accommodating chamber.

10. The test carrier according to claim 9, wherein
the first hole part has a circular cross-sectional shape,
each of the second hole parts has a circular cross-sectional shape having an inner diameter smaller than an inner diameter of the first hole part,
the movable valve has a circular shape having an outer diameter encompassing the second hole parts, and
the accommodating chamber has a circular cross-sectional shape having an inner diameter larger than the outer diameter of the movable valve.

11. The test carrier according to claim 6, wherein
the movable valve has an outer diameter that is larger than an inner diameter of the first hole part and is larger than an inner diameter of the second hole part,
the accommodating chamber has an inner diameter that is larger than the outer diameter of the movable valve, and
the movable valve is accommodated in the accommodating chamber and is movable between the first hole part and the second hole part.

12. The test carrier according to claim 6, wherein
the through hole has a third opening opened to the accommodating chamber,
the movable valve comprises:
a fourth opening; and
a valve body through which the fourth opening penetrates, wherein
the first hole part faces the fourth opening,
the second hole part faces the valve body,
with the suction through the through hole, the first hole part and the accommodating chamber communicate with each other through the fourth opening, and
without the suction through the through hole, the valve body covers the third opening.

13. The test carrier according to claim 6, wherein
the movable valve is made of a metal material or a resin material and has rigidity not to deform by suction through the through hole.

14. The test carrier according to claim 6, wherein
the lid comprises a lid body,
the movable valve is made of an elastic material and elastically deformable by suction through the through hole,
the movable valve is fixed to the lid body with a fixer, and
the fixer faces the first hole part.

15. The test carrier according to claim 14, wherein
the accommodating chamber has a groove that connects to the first hole part and faces the second hole part across the movable valve.

* * * * *